(12) United States Patent
Katsuyama

(10) Patent No.: US 8,637,337 B2
(45) Date of Patent: Jan. 28, 2014

(54) METHOD FOR PRODUCING INTEGRATED OPTICAL DEVICE

(71) Applicant: Sumitomo Electric Industries, Ltd., Osaka (JP)

(72) Inventor: Tomokazu Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/740,567

(22) Filed: Jan. 14, 2013

(65) Prior Publication Data

US 2013/0183783 A1 Jul. 18, 2013

(30) Foreign Application Priority Data

Jan. 18, 2012 (JP) ................................. 2012-008030

(51) Int. Cl.
*H01L 33/00* (2010.01)

(52) U.S. Cl.
USPC .......................... 438/47; 257/436; 372/45.01

(58) Field of Classification Search
USPC ..................... 438/47; 257/436; 372/50, 45.01
See application file for complete search history.

(56) References Cited

U.S. PATENT DOCUMENTS

| 4,791,647 | A | * | 12/1988 | Sugou ........................ | 372/45.01 |
| 5,335,241 | A | * | 8/1994 | Okumura et al. .......... | 372/46.01 |
| 5,862,168 | A | * | 1/1999 | Schilling et al. ............. | 372/50.1 |
| 2002/0001328 | A1 | * | 1/2002 | Albrecht et al. ................ | 372/50 |
| 2003/0067953 | A1 | * | 4/2003 | Kim et al. ........................ | 372/43 |
| 2004/0179569 | A1 | * | 9/2004 | Sato et al. ........................ | 372/50 |
| 2006/0050752 | A1 | * | 3/2006 | Nunoya et al. ............. | 372/43.01 |
| 2007/0223857 | A1 | * | 9/2007 | Nunoya et al. .................. | 385/14 |
| 2008/0003704 | A1 | * | 1/2008 | Katsuyama .................... | 438/16 |
| 2009/0117676 | A1 | * | 5/2009 | Katsuyama .................... | 438/24 |
| 2009/0129418 | A1 | * | 5/2009 | Matsumura ................ | 372/44.01 |
| 2010/0112741 | A1 | * | 5/2010 | Rosso et al. ................... | 438/42 |
| 2013/0010824 | A1 | * | 1/2013 | Okumura et al. .......... | 372/45.01 |

FOREIGN PATENT DOCUMENTS

| JP | 2002-243964 | 8/2002 |
| JP | 2005-55764 | 3/2005 |
| JP | 2010-283104 | 12/2010 |

\* cited by examiner

*Primary Examiner* — Alexander Ghyka
*Assistant Examiner* — Stanetta Isaac
(74) *Attorney, Agent, or Firm* — Smith, Gambrell & Russell, LLP

(57) ABSTRACT

A method for producing an integrated optical device includes the steps of preparing a substrate including first and second regions; growing, on the substrate, a first stacked semiconductor layer including a first optical waveguiding layer, first and second cladding layers, and a first etch-stop layer between the first and second cladding layers; etching the first stacked semiconductor layer through a first etching mask formed on the first region; selectively growing, on the second region through the first etching mask, a second stacked semiconductor layer, third and fourth cladding layers, and a second etch-stop layer between the third and fourth cladding layers; and forming a ridge structure by etching the second and fourth cladding layers. The step of etching the first stacked semiconductor layer includes a step of forming a first overhang between the first and second cladding layers by selectively etching the first etch-stop layer by wet etching.

14 Claims, 29 Drawing Sheets

METHOD FOR PRODUCING INTEGRATED OPTICAL DEVICE

BACKGROUND OF THE INVENTION

1. Field of the Invention

The present invention relates to a method for producing an integrated optical device.

2. Description of the Related Art

Patent Reference 1 (Japanese Unexamined Patent Application Publication No. 2010-283104) describes an integrated optical device having a butt-joint structure. This integrated optical device has a ridge waveguide structure. Patent Reference 1 describes the following method for producing an integrated optical device. First, an n-type InP lower cladding layer, an active layer, a grating layer, and a p-type InP cover layer that are to constitute a semiconductor laser are grown on an n-type InP substrate. Second, portions of the n-type InP lower cladding layer, the active layer, and the p-type InP cover layer are removed by wet etching. After that, on the region of the n-type InP substrate from which the portions have been removed, an n-type InP lower cladding layer, an active layer, and a p-type InP cover layer that are to constitute an electric absorption optical modulator are grown. As a result, the active layer of the electric absorption optical modulator is coupled to the active layer of the semiconductor laser by a butt-joint method. The p-type InP cover layer is then removed. A diffraction grating is subsequently formed in the grating layer of the semiconductor laser. A p-type InP upper cladding layer is grown over the semiconductor laser and the electric absorption optical modulator. A ridge structure extending in a predetermined waveguiding direction is then formed.

SUMMARY OF THE INVENTION

FIGS. 28A to 28C illustrate an example of a method for producing an integrated optical device having a butt-joint structure. The integrated optical device is produced in the following manner. Referring to FIG. 28A, a lower cladding layer 112, an optical waveguiding layer 114, and an upper cladding layer 116 that are to constitute a first semiconductor device are grown on a semiconductor substrate 102. Subsequently, referring to FIG. 28B, a mask 118 for covering a portion that is to serve as a first semiconductor device 110 is formed. A portion other than the first semiconductor device 110 is then removed by etching through the mask 118. Referring to FIG. 28C, a lower cladding layer 122, an optical waveguiding layer 124, and an upper cladding layer 126 that are to constitute a second semiconductor device 120 are then selectively grown through the mask 118 on the semiconductor substrate 102. After that, various optical waveguide structures (for example, the ridge structure of the integrated optical device in Patent Ref. 1) are formed.

However, in this production method, during growth of the semiconductor layers (lower cladding layer 122, optical waveguiding layer 124, and upper cladding layer 126) that are to constitute the second semiconductor device 120, referring to FIG. 28C, a phenomenon occurs in which these semiconductor layers rise up in a region near the boundary between the second semiconductor device 120 and the first semiconductor device 110. Subsequently, in the formation of a ridge structure 130 by etching, referring to FIG. 29, the risen-up portions remain as raised portions in regions (regions D in FIG. 29) adjacent to the side surfaces of the ridge structure 130. This is because, in the formation of the ridge structure 130, the risen-up portions of the optical waveguiding layer 124 and the upper cladding layers 116 and 126 are etched at different etching rates. Such raised portions may cause disturbance in the optical waveguide mode and influence on, for example, lasing characteristics of the semiconductor laser.

A method for producing an integrated optical device according to a first aspect of the present invention includes the steps of preparing a substrate including first and second regions arranged in a predetermined direction; growing, on the first and second regions of the substrate, a first stacked semiconductor layer including a first optical waveguiding layer, first and second cladding layers positioned on the first optical waveguiding layer, and a first etch-stop layer positioned between the first and second cladding layers, the first etch-stop layer having a composition different from compositions of the first and second cladding layers; etching the first stacked semiconductor layer through a first etching mask formed on the first region until the first optical waveguiding layer is exposed; selectively growing, on the second region through the first etching mask, a second stacked semiconductor layer including a second optical waveguiding layer, third and fourth cladding layers positioned on the second optical waveguiding layer, and a second etch-stop layer positioned between the third and fourth cladding layers, the second etch-stop layer having a composition different from compositions of the third and fourth cladding layers; and forming a ridge structure by etching the second and fourth cladding layers through a second etching mask formed on the first and second stacked semiconductor layers, the second etching mask longitudinally extending in the predetermined direction. In addition, the step of etching the first stacked semiconductor layer includes a step of forming a first overhang between the first and second cladding layers by selectively etching the first etch-stop layer by wet etching with an etchant having a higher etching rate for the first etch-stop layer than for the first and second cladding layers, the first overhang being constituted by the second cladding layer.

In the method for producing an integrated optical device, the first stacked semiconductor layer includes the first etch-stop layer positioned between the first and second cladding layers. The first etch-stop layer has a composition different from compositions of the first and second cladding layers. In the step of etching the first stacked semiconductor layer, the first etch-stop layer is etched faster than the overlying and underlying layers (first and second cladding layers) by wet etching. Then, an overhang (first overhang) disposed between the first and second cladding layers is formed. When the second optical waveguiding layer is grown on the second region of the substrate in the step of selectively growing the second stacked semiconductor layer, the first overhang can suppress rising up of the second optical waveguiding layer in a region near the boundary between the second optical waveguiding layer and the first stacked semiconductor layer. Thus, in the step of forming a ridge structure, formation of raised portions in regions adjacent to the side surfaces of the ridge structure can be suppressed and the flatness of these regions can be enhanced. Therefore, disturbance in the optical waveguide mode can be suppressed. Furthermore, lasing characteristics of the semiconductor laser can be improved.

In the method for producing an integrated optical device, the first and second cladding layers are preferably formed of InP. The first etch-stop layer is preferably formed of InGaAsP. In addition, in the step of forming the first overhang, the first etch-stop layer is preferably etched by the etchant containing sulfuric acid and hydrogen peroxide.

In the method for producing an integrated optical device, in the step of forming the ridge structure, the second and fourth cladding layers are preferably etched by wet etching with an etchant having higher etching rates for the second and fourth cladding layers than for the first and second etch-stop layers.

In the method for producing an integrated optical device, the first to fourth cladding layers are preferably formed of InP. The first and second etch-stop layers are preferably formed of InGaAsP. In addition, in the step of forming the ridge structure, the second and fourth cladding layers are preferably etched by wet etching with the etchant containing hydrogen bromide.

In the method for producing an integrated optical device, the first stacked semiconductor layer may further include a side-etching layer formed on the second cladding layer, the side-etching layer having a different composition from a composition of the second cladding layer. The step of etching the first stacked semiconductor layer may further include a step of forming a second overhang between the second cladding layer and the first etching mask by selectively etching the side-etching layer by wet etching with an etchant having a higher etching rate for the side-etching layer than for the second cladding layer, the second overhang being constituted by the first etching mask. The first and second etch-stop layers and the side-etching layer are preferably formed of InGaAsP. In the steps of forming the first and second overhangs in the step of etching the first stacked semiconductor layer, the first etch-stop layer and the side-etching layer are preferably etched by the etchant containing sulfuric acid and hydrogen peroxide. When the fourth cladding layer is grown in the step of selectively growing the second stacked semiconductor layer, the second overhang can effectively suppress rising up of the fourth cladding layer in a region near the boundary between the fourth cladding layer and the first stacked semiconductor layer.

The method for producing an integrated optical device may further include, after the step of selectively growing the second stacked semiconductor layer, a step of growing an upper cladding layer and a contact layer on the first stacked semiconductor layer and the second stacked semiconductor layer; and after the step of forming the ridge structure, a step of forming electrodes on the contact layer, the electrodes being formed on the first and second stacked semiconductor layers, respectively. The step of forming the electrodes may include a step of electrically separating the first stacked semiconductor layer and the second stacked semiconductor layer from each other by etching a portion of contact layer formed between the first and second stacked semiconductor layers.

In the method for producing an integrated optical device, the first stacked semiconductor layer may further include a contact layer formed on the second cladding layer, the contact layer having a composition different from a composition of the second cladding layer. In addition, the step of etching the first stacked semiconductor layer may further include a step of forming a third overhang between the second cladding layer and the first etching mask by selectively etching the contact layer by wet etching with an etchant having a higher etching rate for the contact layer than for the second cladding layer, the third overhang being constituted by the first etching mask. When the fourth cladding layer is grown in the step of selectively growing the second stacked semiconductor layer, the third overhang can suppress rising up of the fourth cladding layer in a region near the boundary between the fourth cladding layer and the first stacked semiconductor layer. As a result, the flatness of the upper surfaces of the first and second stacked semiconductor layers can be enhanced. In addition, the third overhang is formed by using the difference in etching rates for the second cladding layer and the contact layer. Thus, it is not necessary to form a semiconductor layer dedicated solely to the formation of such an overhang (third overhang), between the second cladding layer and the contact layer. Accordingly, the number of production steps can be decreased. In addition, the contact layer is positioned uppermost among the semiconductor layers constituting the ridge structure. Accordingly, the flatness of the side surfaces of the ridge structure can be enhanced, compared with the case where a semiconductor layer for forming an overhang is formed at an intermediate position in the ridge structure. The contact layer is preferably formed of InGaAs. In the steps of forming the first and third overhangs in the step of etching the first stacked semiconductor layer, the first etch-stop layer and the contact layer are etched by the etchant containing sulfuric acid and hydrogen peroxide.

A method for producing an integrated optical device according to a second aspect of the present invention includes the steps of preparing a substrate including first and second regions arranged in a predetermined direction; growing, on the first and second regions of the substrate, a first stacked semiconductor layer including a first optical waveguiding layer, a first cladding layer positioned on the first optical waveguiding layer, and a first etch-stop layer positioned on the first cladding layer, the first etch-stop layer having a composition different from a composition of the first cladding layer; etching the first stacked semiconductor layer through a first etching mask formed on the first region until the first optical waveguiding layer is exposed; selectively growing, on the second region through the first etching mask, a second stacked semiconductor layer including a second optical waveguiding layer, a third cladding layer positioned on the second optical waveguiding layer, and a second etch-stop layer positioned on the third cladding layer, the second etch-stop layer having a composition different from a composition of the third cladding layer; growing a fifth cladding layer on the first and second stacked semiconductor layers, the fifth cladding layer having a composition different from compositions of the first and second etch-stop layers; and forming a ridge structure by etching the fifth cladding layer through a second etching mask formed on the fifth cladding layer on the first and second regions, the second etching mask longitudinally extending in the predetermined direction. In addition, the step of etching the first stacked semiconductor layer includes a step of forming an overhang between the first cladding layer and the first etching mask by selectively etching the first etch-stop layer by wet etching with an etchant having a higher etching rate for the first etch-stop layer than for the first cladding layer, the overhang being constituted by the first etching mask.

In the method for producing an integrated optical device, the first stacked semiconductor layer includes the first etch-stop layer positioned on the first cladding layer. The first etch-stop layer has a composition different from a composition of the first cladding layer. In the step of etching the first stacked semiconductor layer, the first etch-stop layer is etched faster than the underlying layer (first cladding layer) by wet etching. Then, an overhang disposed between the first cladding layer and the first etching mask. When the second optical waveguiding layer is grown on the second region of the substrate in the step of selectively growing the second stacked semiconductor layer, the overhang can suppress rising up of the second optical waveguiding layer in a region near the boundary between the second optical waveguiding layer and the first stacked semiconductor layer. Thus, in the step of forming a ridge structure, formation of raised portions in regions adjacent to the side surfaces of the ridge structure can be suppressed and the flatness of these regions can be enhanced. Therefore, disturbance in the optical waveguide mode can be suppressed. Furthermore, lasing characteristics of the semiconductor laser can be improved.

In the method for producing an integrated optical device, in the step of growing the first stacked semiconductor layer, the first etch-stop layer used for controlling etching depth in the step of forming a ridge structure is grown on the first cladding layer. In this case, the first etch-stop layer is a top layer of the first stacked semiconductor layer. Subsequently, in the step of growing the fifth cladding layer, the fifth cladding layer is grown on the first etch-stop layer. In the step of etching the first stacked semiconductor layer, the overhang is formed by using the difference in etching rates for the first etch-stop layer and the underlying layer (first cladding layer). Thus, it is not necessary to form a semiconductor layer for forming such an overhang at an intermediate position of the ridge structure. A stepped structure in the side surfaces of the ridge structure may be formed due to the presence of the semiconductor layer for forming the overhang. Accordingly, the stepped structure in the side surfaces of the ridge structure does not formed. As a result, operation characteristics of an integrated optical device such as lasing characteristics of the semiconductor laser can be further enhanced.

In the method for producing an integrated optical device, the first, third, and fifth cladding layers are preferably formed of InP. The first and second etch-stop layers are preferably formed of InGaAsP. In addition, in the step of forming the overhang, the first etch-stop layer is preferably etched by the etchant containing sulfuric acid and hydrogen peroxide.

In the method for producing an integrated optical device, in the step of forming the ridge structure, the fifth cladding layer is preferably etched by wet etching with an etchant having a higher etching rate for the fifth cladding layer than for the first and second etch-stop layers. The first, third, and fifth cladding layers are preferably formed of InP. The first and second etch-stop layers are preferably formed of InGaAsP. In addition, in the step of forming the ridge structure, the fifth cladding layer is preferably etched by wet etching with the etchant containing hydrogen bromide.

DESCRIPTION OF THE PREFERRED EMBODIMENTS

Hereinafter, methods for producing an integrated optical device according to embodiments of the present invention will be described in detail with reference to attached drawings. In descriptions of the drawings, like reference signs are used to denote like elements and redundant descriptions are omitted.

In the production methods described below, semiconductor layers are suitably formed by, for example, a metal-organic vapor phase epitaxy (MOVPE) method. Suitable examples of an n-type dopant include Sn and Si. Suitable examples of a p-type dopant include Zn. Values in parentheses representing the thicknesses of semiconductor layers are mere examples. If necessary, the thicknesses of semiconductor layers can be increased or decreased.

First Embodiment

Figure 1:
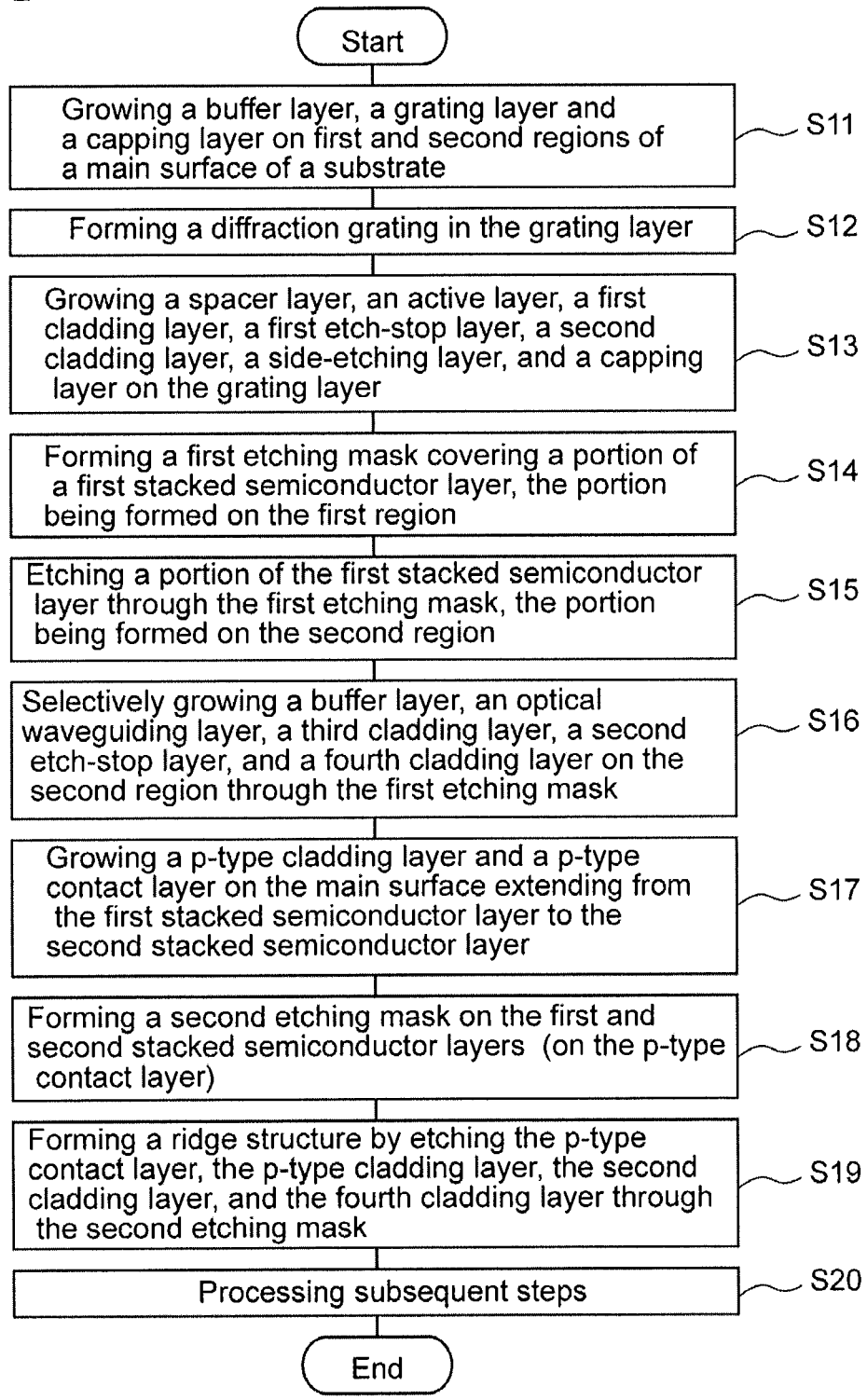
FIG. 1 is a flow chart of a method for producing an integrated optical device according to a first embodiment of the present invention.

FIG. 1 is a flow chart of a method for producing an integrated optical device according to a first embodiment of the present invention. FIGS. 2A to 13B are perspective views and sectional views illustrating the steps in FIG. 1.

<First Growth Step>

Figure 2A:
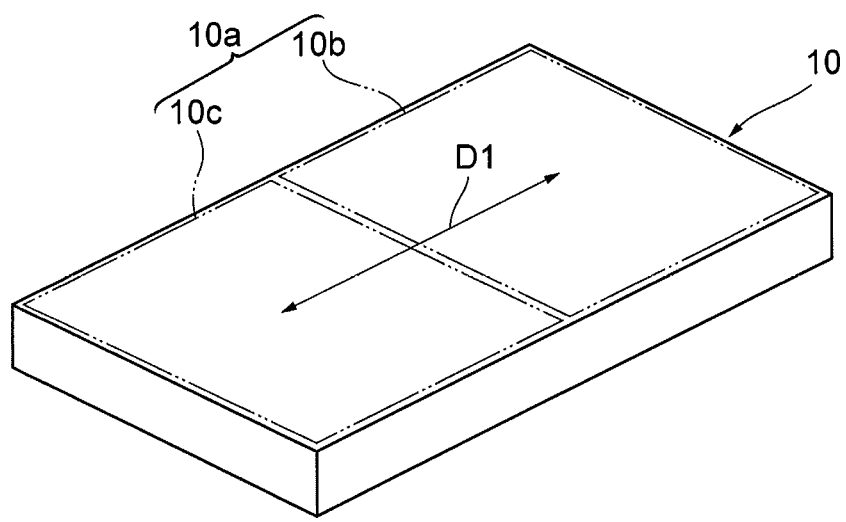
FIGS. 2A and 2B illustrate a first growth step.

In this production method, referring to FIG. 2A, an n-type InP substrate 10 having a main surface 10a is prepared. The n-type InP substrate 10 serves as a substrate in the first embodiment. The n-type InP substrate 10 includes a first region 10b and a second region 10c that are arranged in a predetermined direction (arrow D1 in FIG. 2A). Specifically, the main surface 10a of the n-type InP substrate 10 includes a first region 10b and a second region 10c. The predetermined direction is a waveguiding direction in the integrated optical device in the embodiment. The main surface 10a mainly includes the (001) plane of the crystalline InP substrate. The predetermined direction D1 preferably corresponds to the <110> direction of the InP substrate.

Figure 2B:
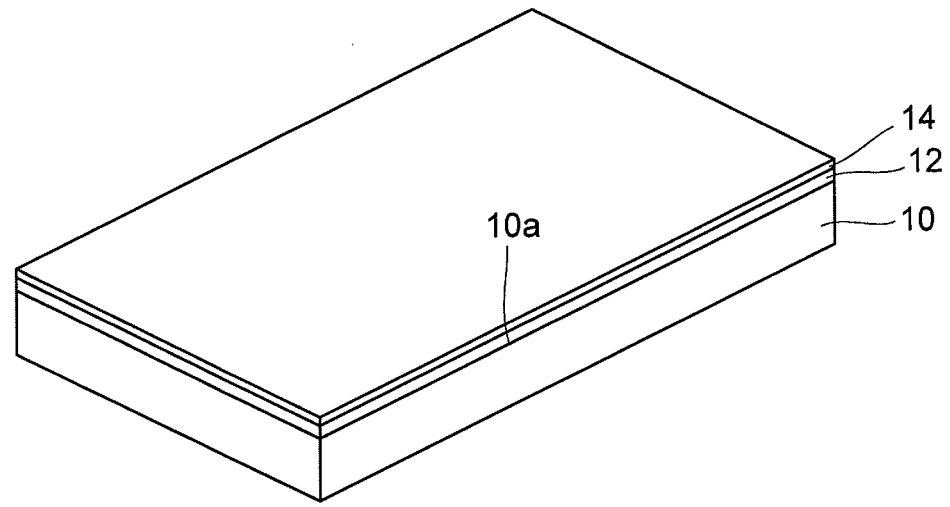

Referring to FIG. 2B, on the main surface 10a (first region 10b and second region 10c) of the n-type InP substrate 10, a buffer layer 12 (thickness: 500 nm), a grating layer 14 (thickness: 80 nm), and a capping layer (thickness: 10 nm; not shown) are then grown in this order (step S11 in FIG. 1). The buffer layer 12 and the capping layer are formed of, for example, n-type InP. The grating layer 14 is formed of a material having a higher refractive index than the buffer layer 12 and the capping layer. The grating layer 14 is formed of, for example, n-type InGaAsP. The grating layer 14 has a bandgap wavelength of, for example, 1330 nm. Here, the bandgap wavelength is related to the bandgap energy of a semiconductor material. Furthermore, the bandgap energy Eg (eV) and the bandgap wavelength λg (μm) have the relationship of λg=1.24/Eg. The n-type InP substrate 10, the buffer layer 12, the grating layer 14, and the capping layer have an impurity concentration of, for example, $5 \times 10^{17}$ cm$^{-3}$.

An etching mask is then formed on the grating layer 14 by an interference exposure method. After that, the grating layer 14 is etched through this etching mask (preferably by a dry etching process). As a result, referring to FIG. 3A, a diffraction grating is formed in the grating layer 14 (step S12 in FIG. 1).

Figure 3A:
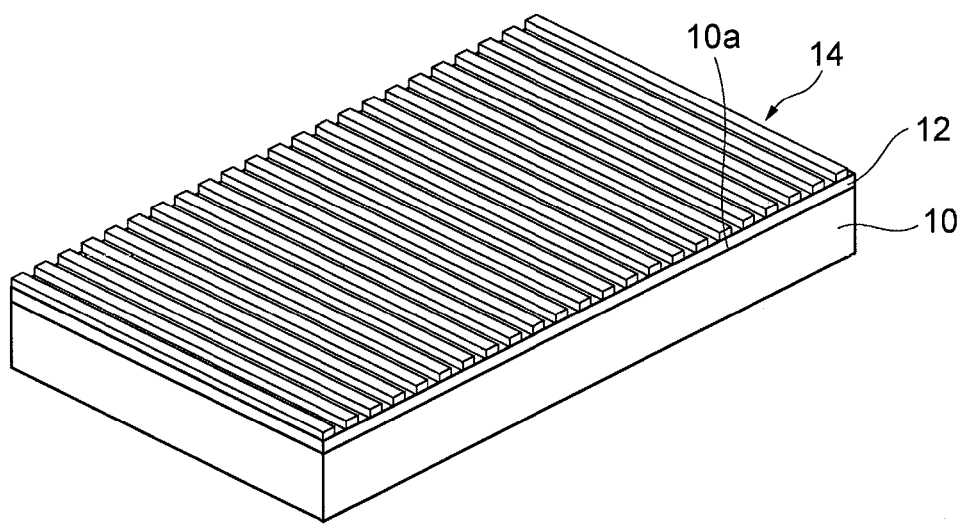
FIGS. 3A and 3B illustrate a first growth step.
Figure 3B:
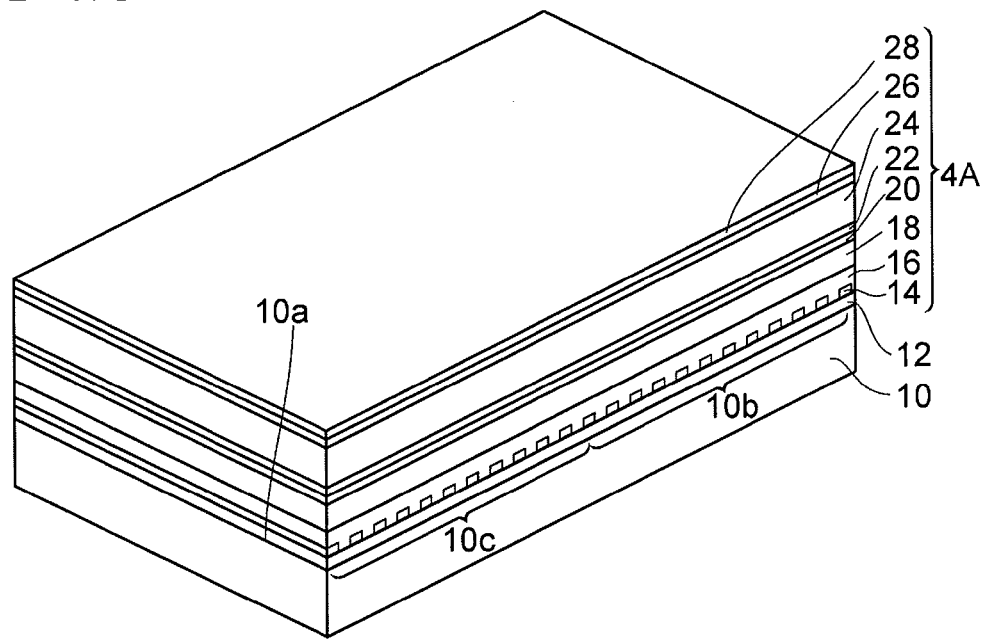

Referring to FIG. 3B, on the grating layer 14 in which the diffraction grating is formed, a spacer layer 16 (thickness with respect to the upper surface of the grating layer 14: 100 nm), an active layer 18, a first cladding layer 20 (thickness: 60 nm), a first etch-stop layer 22 (thickness: 10 nm), a second cladding layer 24 (thickness: 460 nm), a side-etching layer 26 (thickness: 20 nm), and a capping layer 28 (thickness: 20 nm) are grown in this order (step S13 in FIG. 1). The spacer layer 16 is formed of, for example, n-type InP. The first cladding layer 20 and the second cladding layer 24 are formed of, for example, p-type InP. The first etch-stop layer 22 is different in composition from the first cladding layer 20 and the second cladding layer 24 and is disposed between the first cladding layer 20 and the second cladding layer 24. Specifically, the first etch-stop layer 22 is formed of a material allowing etching selectivity with respect to the first cladding layer 20 and the second cladding layer 24. The first etch-stop layer 22 is formed of, for example, p-type InGaAsP. The first etch-stop layer 22 has a bandgap wavelength of, for example, 1100 nm.

The side-etching layer 26 is formed of a material allowing etching selectivity with respect to the second cladding layer 24. The side-etching layer 26 is formed of, for example, p-type InGaAsP. The side-etching layer 26 has a bandgap wavelength of, for example, 1150 nm. The capping layer 28 is formed of, for example, p-type InP. The spacer layer 16, the first cladding layer 20, the first etch-stop layer 22, the second cladding layer 24, the side-etching layer 26, and the capping layer 28 have an impurity concentration of, for example, $5 \times 10^{17}$ cm$^{-3}$.

The active layer 18 serves as a first optical waveguiding layer in the first embodiment. For example, the active layer 18 has a multi quantum well (MQW) structure in which a barrier layer and a well layer are alternately stacked. The barrier layer is formed of, for example, InGaAsP, and has a bandgap wavelength of, for example, 1200 nm. The well layer is formed of, for example, InGaAsP. The composition of the well layer is adjusted such that light emitted from the active layer 18 has a wavelength of, for example, 1550 nm. Specifically, the well layer is formed of, for example, InGaAsP having a bandgap wavelength of 1590 nm. For example, the barrier layer has a thickness of 10 nm and the well layer has a thickness of 5 nm. The well layer may have, for example, 1% compressive strain. The number of the well layer is, for example, seven.

Separate confinement heterostructure (SCH) layers having a composition providing a smaller refractive index than the active layer 18 may be further disposed as an overlying layer and an underlying layer of the active layer 18. The SCH layers are formed of, for example, InGaAsP of which composition has a bandgap wavelength of, for example, 1150 nm. The overlying and underlying SCH layers each have a thickness of, for example, 50 nm.

As a result of the above-described steps, a first stacked semiconductor layer 4A illustrated in FIG. 3B is formed on the main surface 10a of the n-type InP substrate 10. The first stacked semiconductor layer 4A includes the grating layer 14, the spacer layer 16, the active layer 18, the first cladding layer 20, the first etch-stop layer 22, the second cladding layer 24, the side-etching layer 26, and the capping layer 28. A portion of the first stacked semiconductor layer 4A, the portion being formed on the first region 10b, functions as a distributed feedback (DFB) laser diode.

<First Etching Step>

Figure 4:
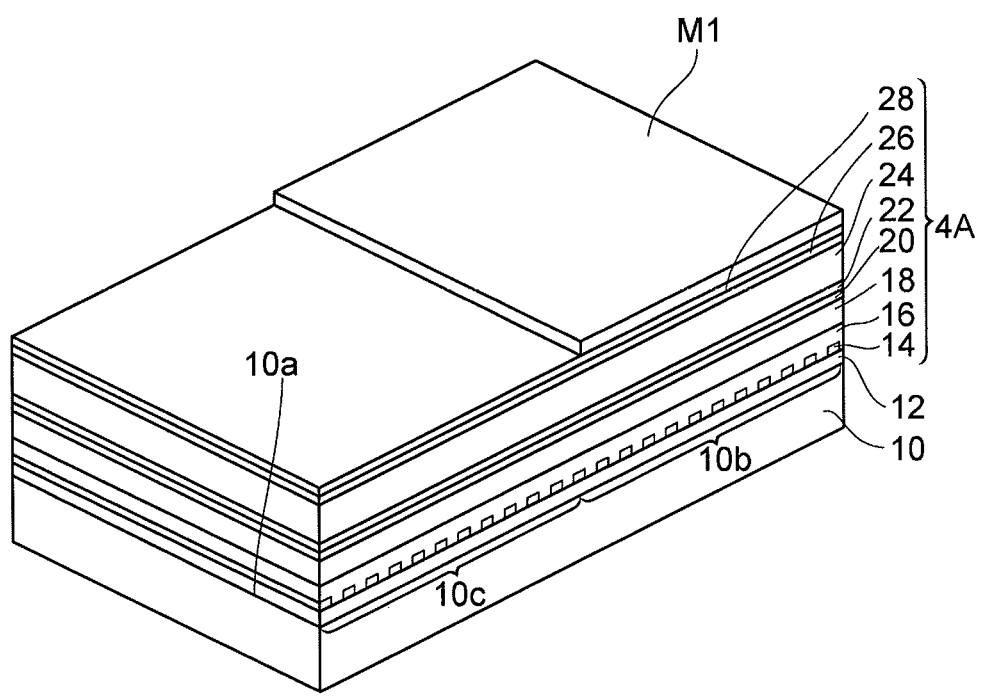
FIG. 4 illustrates a first etching step.

Referring to FIG. 4, a first etching mask M1 covering a portion of the first stacked semiconductor layer 4A, the portion being formed on the first region 10b, is then formed on the first stacked semiconductor layer 4A (step S14 in FIG. 1). The first etching mask M1 is a dielectric film formed of, for example, SiO$_2$ or SiN. For example, the first etching mask M1 is deposited on the first stacked semiconductor layer 4A by a chemical vapor deposition (CVD) method. After that, a resist mask is formed on the first etching mask M1 by the standard photolithography technique. The first etching mask M1 is etched through the resist mask. As a result of such processes, the first etching mask M1 is suitably formed.

Figure 5A:
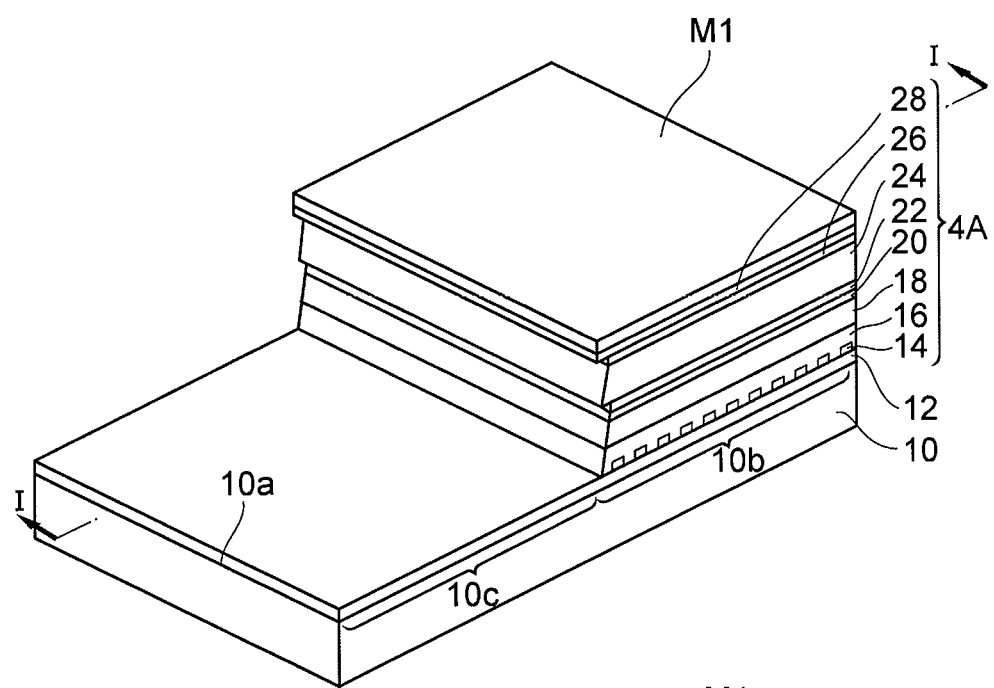
FIGS. 5A and 5B illustrate a first etching step.

Referring to FIG. 5A, a portion of the first stacked semiconductor layer 4A, the portion being formed on the second region 10c, is then etched through the first etching mask M1 by, for example, wet etching. As a result of this etching, the active layer 18 is exposed (step S15 in FIG. 1). For example, in the first embodiment, etching is performed with different etchants selected for semiconductor layers of the first stacked semiconductor layer 4A until the buffer layer 12 is exposed. In particular, the side-etching layer 26 and the first etch-stop layer 22 are etched by wet etching with an etchant having higher etching rates for these layers than for the capping layer 28, the second cladding layer 24, and the first cladding layer 20.

In an example, an etchant containing hydrochloric acid and acetic acid is used for etching the capping layer 28. On the other hand, an etchant containing hydrogen bromide is used for etching the second cladding layer 24, the first cladding layer 20, and the spacer layer 16 that are mainly formed of InP. Another etchant containing sulfuric acid and hydrogen peroxide is used for etching the side-etching layer 26 and the first etch-stop layer 22 that are mainly formed of InGaAsP. As a result, these layers can be etched faster than the capping layer 28, the second cladding layer 24, and the first cladding layer 20. The active layer 18 and the grating layer 14 that are mainly formed of InGaAsP are preferably etched with an etchant containing hydrochloric acid and hydrogen peroxide.

Figure 5B:
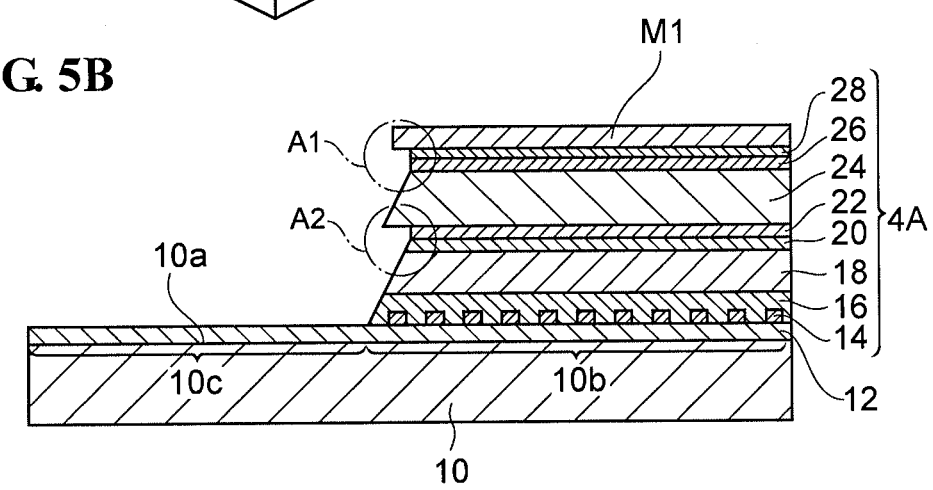

FIG. 5B is a sectional side view illustrating a section taken along line I-I in FIG. 5A. In the first embodiment, the etched end surface of the first stacked semiconductor layer 4A is mainly constituted by the (111) planes of InP-based semiconductors and has a normal mesa structure. When the side-etching layer 26 is etched, the etching rate for the side-etching layer 26 is higher than that for the second cladding layer 24. Accordingly, the end surface of the side-etching layer 26 is etched farther in than the end surfaces of the first etching mask M1 serving as an etching mask and the second cladding layer 24. Thus, as illustrated in a portion A1 in FIG. 5B, an overhang constituted by the first etching mask M1 is formed between the first etching mask M1 and the second cladding layer 24. In the first embodiment, the capping layer 28 is formed between the first etching mask M1 and the side-etching layer 26. When the side-etching layer 26 is etched, the etching rate for the side-etching layer 26 is higher than that for the capping layer 28. Accordingly, another overhang constituted by the capping layer 28 may slightly remain. Similarly, when the first etch-stop layer 22 is etched, the etching rate for the first etch-stop layer 22 is higher than those for the second cladding layer 24 and the first cladding layer 20. Accordingly, the end surface of the first etch-stop layer 22 is etched farther in than the end surfaces of the second cladding layer 24 and the first cladding layer 20. Thus, as illustrated in a portion A2 in FIG. 5B, another overhang constituted by the second cladding layer 24 is formed between the second cladding layer 24 and the first cladding layer 20. The overhang constituted by the second cladding layer 24 and formed between the second cladding layer 24 and the first cladding layer 20 serves as a first overhang in the first embodiment. The overhang constituted by the first etching mask M1 and formed between the first etching mask M1 and the second cladding layer 24 serves as a second overhang in the first embodiment.

<Second Growth Step>

Figure 6A:
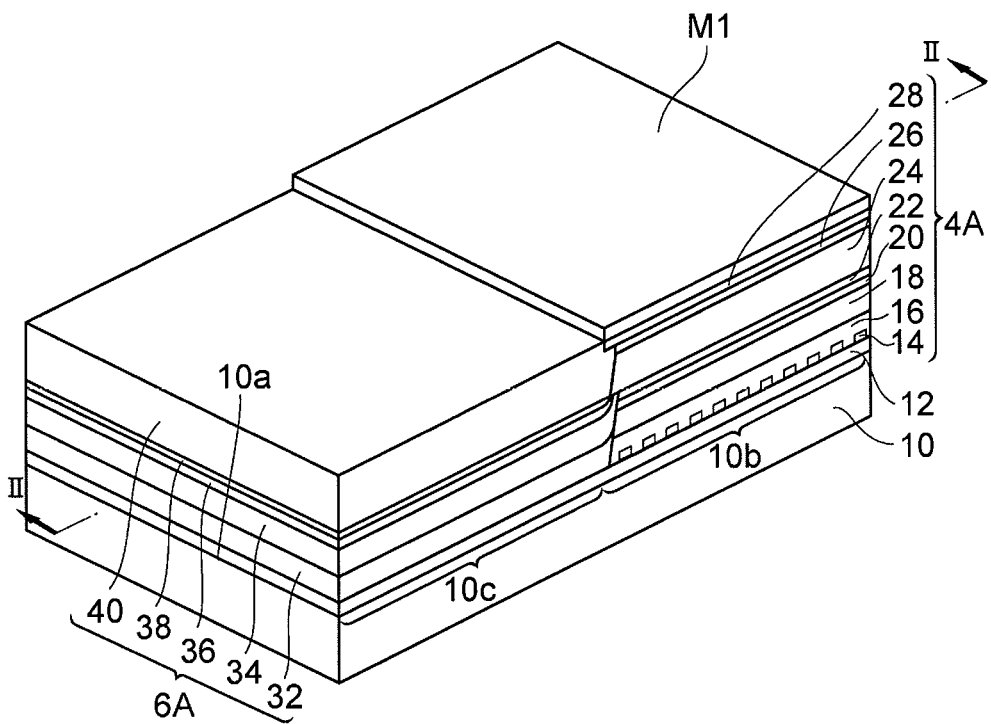
FIGS. 6A and 6B illustrate a second growth step.

Referring to FIG. 6A, on the second region 10c of the main surface 10a of the n-type InP substrate 10, a buffer layer 32 (thickness: 50 nm), an optical waveguiding layer 34, a third cladding layer 36 (thickness: 60 nm), a second etch-stop layer 38 (thickness: 10 nm), and a fourth cladding layer 40 are selectively grown through the first etching mask M1 (butt-joint coupling step, step S16 in FIG. 1). The thickness of the fourth cladding layer 40 is adjusted such that the fourth cladding layer 40 is flush with the upper surface of the capping layer 28. The buffer layer 32 is formed of, for example, n-type InP. The third cladding layer 36 and the fourth cladding layer 40 are formed of, for example, p-type InP. The second etch-stop layer 38 is different in composition from the fourth cladding layer 40 and is positioned between the third cladding layer 36 and the fourth cladding layer 40. Specifically, the second etch-stop layer 38 is formed of a material allowing etching selectivity with respect to the fourth cladding layer 40. The second etch-stop layer 38 is formed of, for example, p-type InGaAsP. The second etch-stop layer 38 has a bandgap wavelength of, for example, 1100 nm. The buffer layer 32, the third cladding layer 36, the second etch-stop layer 38, and the fourth cladding layer 40 have an impurity concentration of, for example, $5\times10^{17}$ cm$^{-3}$.

The optical waveguiding layer 34 serves as a second optical waveguiding layer in the first embodiment. The optical waveguiding layer 34 has, for example, a multi quantum well (MQW) structure in which a barrier layer and a well layer are alternately stacked. The barrier layer is formed of, for example, InGaAsP, and has a bandgap wavelength of, for example, 1400 nm. The well layer is formed of, for example, InGaAsP and has a bandgap wavelength of, for example, 1500 nm. The barrier layer has a thickness of, for example, 10 nm. The well layer has a thickness of, for example, 6 nm. The well layer may have, for example, 1% compressive strain.

Figure 6B:
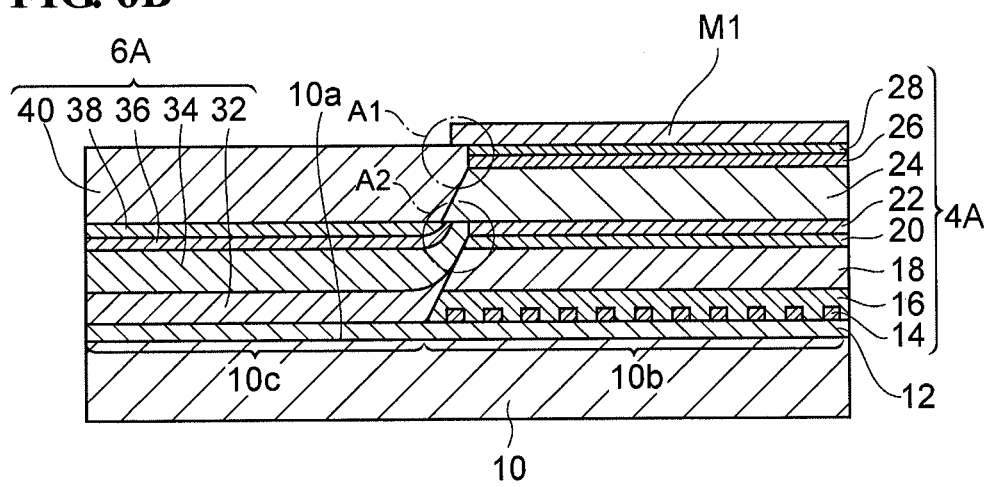

FIG. 6B is a sectional side view illustrating a section taken along line II-II in FIG. 6A. As a result of the above-described first etching step, the overhang is formed (portion A1 in FIG. 6B) between the second cladding layer 24 and the first etching mask M1. During growth of the fourth cladding layer 40 in the second growth step, this overhang effectively suppresses rising up of the fourth cladding layer 40 in a region near the boundary between the fourth cladding layer 40 and the first stacked semiconductor layer 4A. In addition, as a result of the above-described first etching step, another overhang is formed (portion A2 in FIG. 6B) between the first cladding layer 20 and the second cladding layer 24. During growth of the second optical waveguiding layer 34 in the second growth step, this overhang effectively suppresses rising up of the second optical waveguiding layer 34 in a region near the boundary between the second optical waveguiding layer 34 and the first stacked semiconductor layer 4A.

As a result of the above-described steps, a second stacked semiconductor layer 6A illustrated in FIGS. 6A and 6B is formed on the main surface 10a of the n-type InP substrate 10. The second stacked semiconductor layer 6A includes the buffer layer 32, the optical waveguiding layer 34, the third cladding layer 36, the second etch-stop layer 38, and the fourth cladding layer 40. The second stacked semiconductor layer 6A functions as, for example, an electric absorption (EA) optical modulator. The first etching mask M1 is then removed with, for example, hydrofluoric acid.

<Third Growth Step>

Figure 7A:
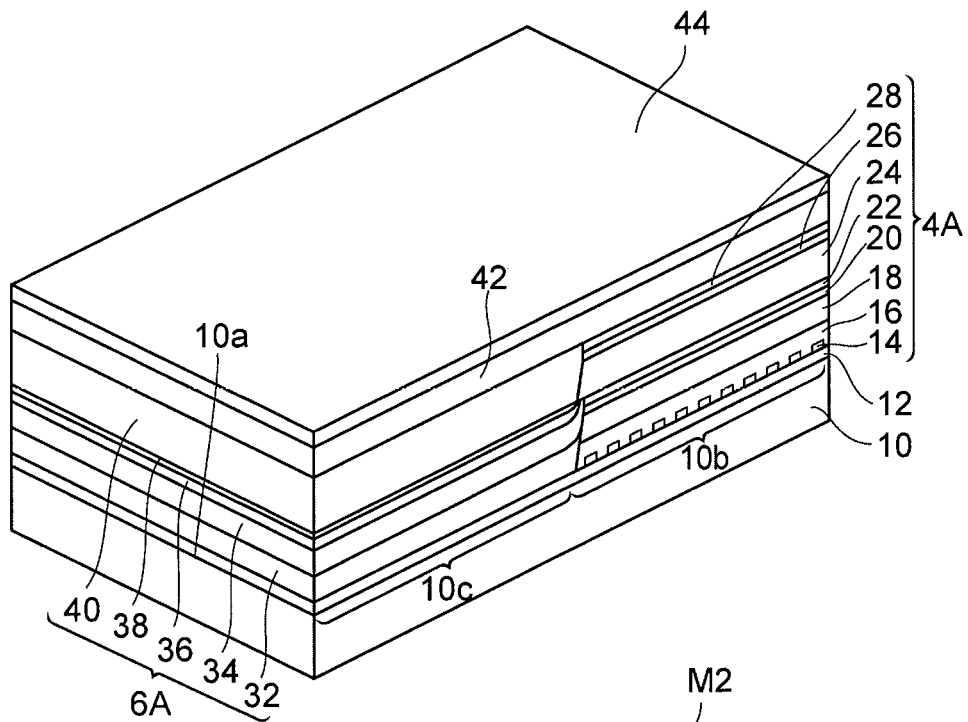
FIG. 7A illustrates a third growth step.

Referring to FIG. 7A, on the main surface 10a extending from the first stacked semiconductor layer 4A to the second stacked semiconductor layer 6A, a p-type cladding layer 42 (thickness: 1200 nm) and a p-type contact layer 44 (thickness: 100 nm) are grown in this order (step S17 in FIG. 1). The p-type cladding layer 42 serves as an upper cladding layer in the first embodiment. The p-type cladding layer 42 is formed of, for example, the same semiconductor material (p-type InP) as in the second cladding layer 24 and the fourth cladding layer 40. The p-type contact layer 44 is formed of a semiconductor material that is used for forming an ohmic contact with an anode electrode (metal electrode) formed in a subsequent step. The p-type contact layer 44 is formed of, for example, p-type InGaAs. The p-type cladding layer 42 has an impurity concentration of, for example, $1\times10^{18}$ cm$^{-3}$. The p-type contact layer 44 has an impurity concentration of, for example, $1.5\times10^{19}$ cm$^{-3}$.

<Second Etching Step>

Figure 7B:
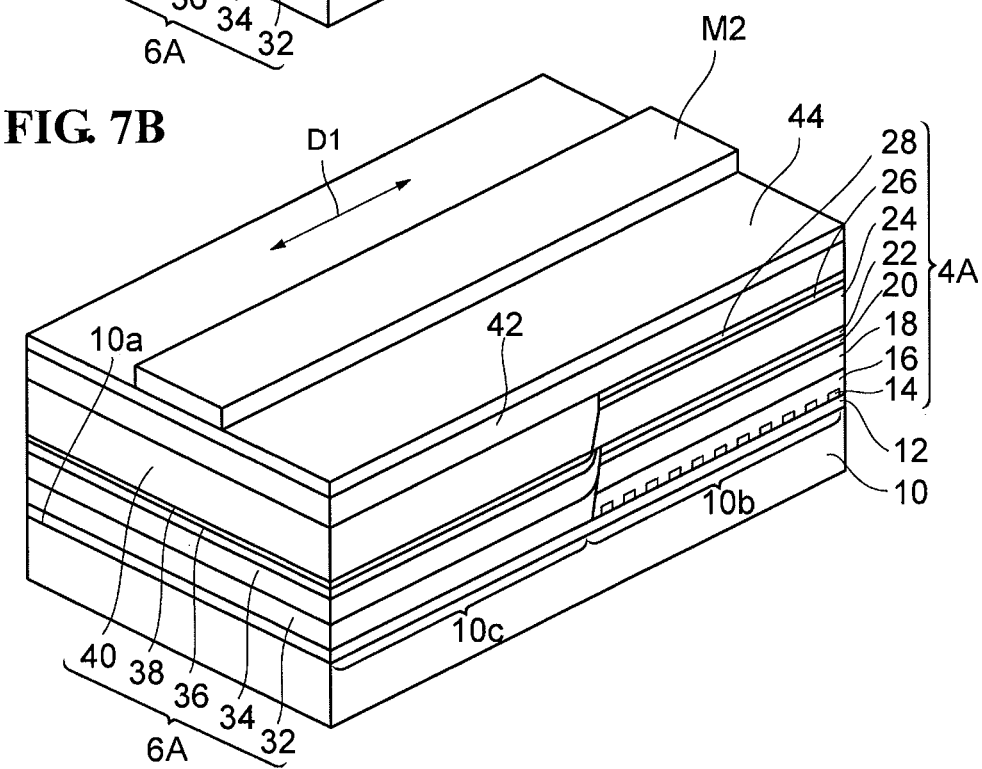
FIG. 7B illustrates a second etching step.
Figure 8:
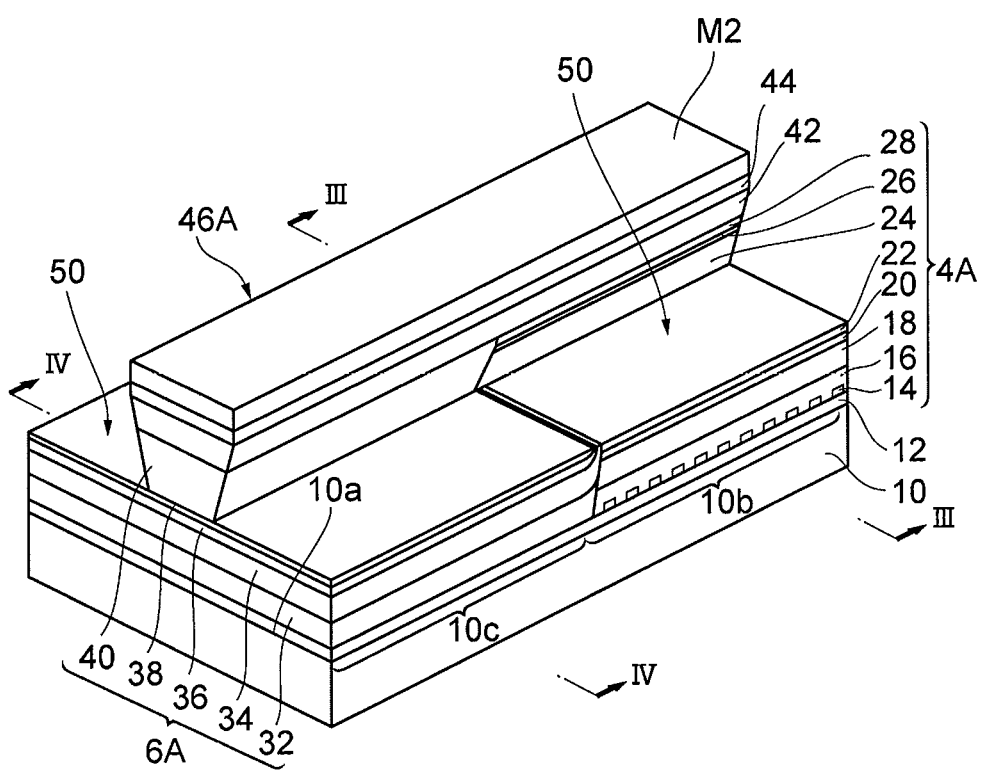
FIG. 8 illustrates a second etching step.

Referring to FIG. 7B, a second etching mask M2 longitudinally extending in the predetermined direction D1 is formed on the first stacked semiconductor layer 4A and the second stacked semiconductor layer 6A (in the first embodiment, on the p-type contact layer 44) (step S18 in FIG. 1). The second etching mask M2 has the shape of a stripe. The second etching mask M2 is a dielectric film formed of, for example, SiO$_2$ or SiN. For example, a SiO$_2$ layer is deposited on the p-type contact layer 44 by a CVD method. After that, a resist mask is formed on the SiO$_2$ layer by the standard photolithography technique. The SiO$_2$ layer is etched through the resist mask. As a result, the second etching mask M2 is suitably formed. Referring to FIG. 8, the p-type contact layer 44, the p-type cladding layer 42, the second cladding layer 24, and the fourth cladding layer 40 are etched through the second etching mask M2 to form a ridge structure 46A (step S19 in FIG. 1).

On lateral sides of the second etching mask M2, other etching masks (not shown) having lateral edges extending along the lateral edges of the second etching mask M2 are further disposed so as to be separated from the second etching mask M2. Thus, each of the side surfaces of the ridge structure 46A constitutes a side wall of a groove 50 extending in the longitudinal direction (predetermined direction D1) of the ridge structure 46A and formed in the first and second stacked semiconductor layers 4A and 6A. In FIG. 8, in order to clearly illustrate the ridge structure 46A, the other side wall of the groove 50 is omitted (refer to FIG. 11A).

Figure 9A:
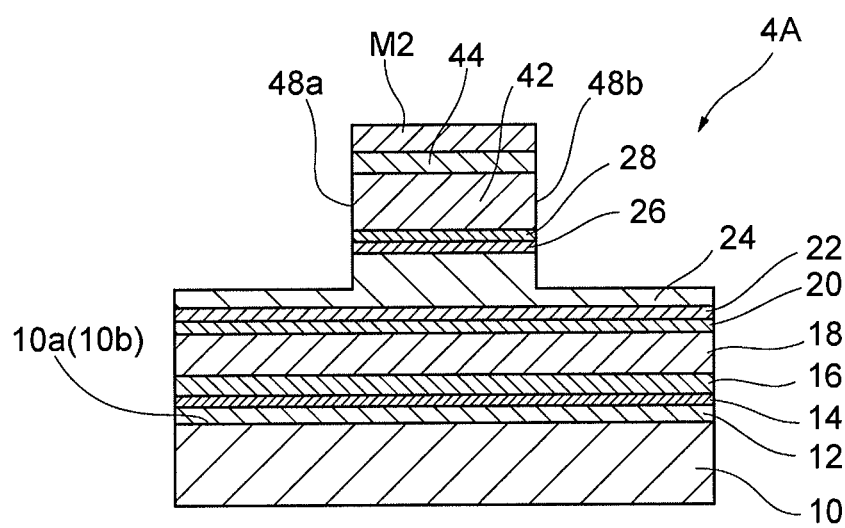
FIGS. 9A and 9B specifically illustrate a second etching step.
Figure 9B:
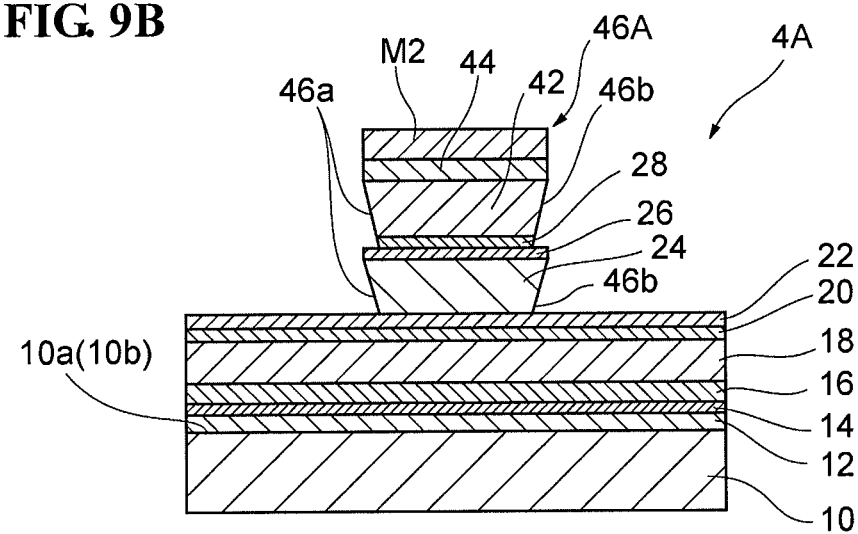
Figure 10A:
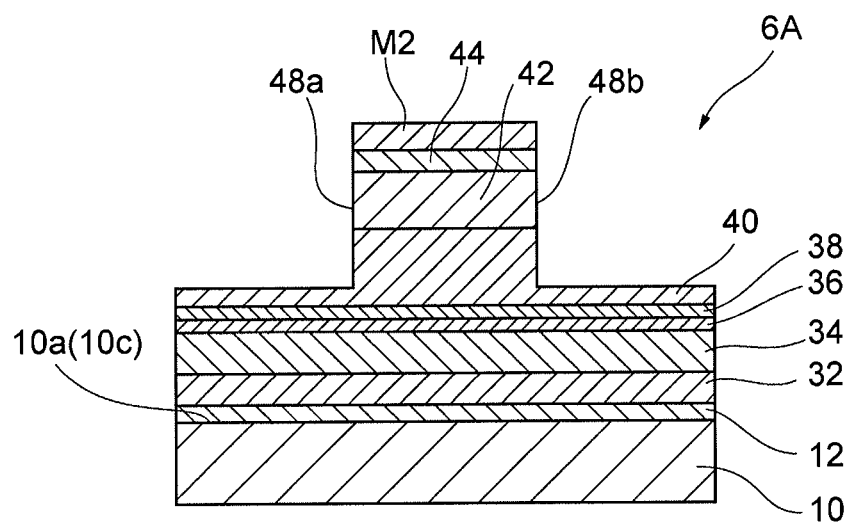
FIGS. 10A and 10B specifically illustrate a second etching step.
Figure 10B:
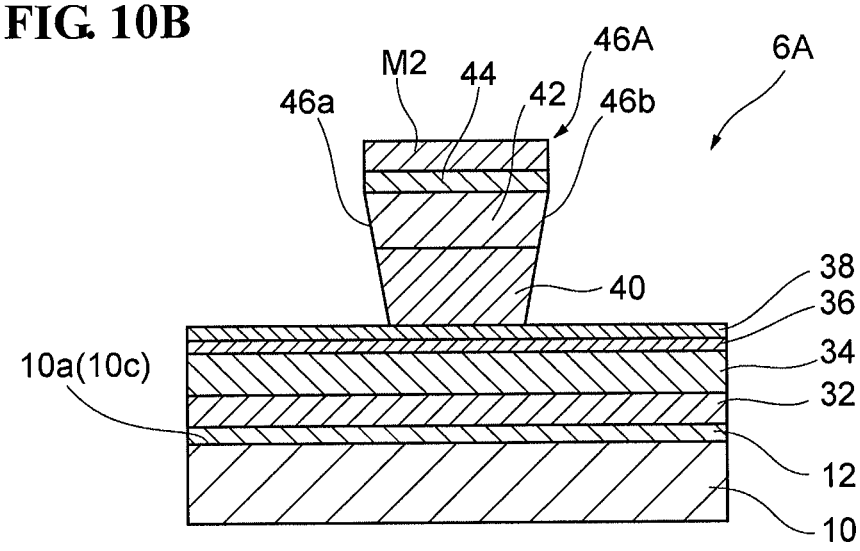

FIGS. 9A, 9B, 10A, and 10B specifically illustrate the second etching step illustrated in FIG. 8. FIGS. 9A and 9B illustrate sections taken along line in FIG. 8. FIGS. 10A and 10B illustrate sections taken along line IV-IV in FIG. 8. Referring to FIGS. 9A and 10A, in the second etching step, the p-type contact layer 44, the p-type cladding layer 42, the second cladding layer 24, and the fourth cladding layer 40 are etched by dry etching using, for example, a gas mixture of methane gas (CH$_4$) and hydrogen gas (H$_2$) as an etching gas. This dry etching is stopped in the middle of the second cladding layer 24 and the fourth cladding layer 40. In this dry etching, the first and second etch-stop layers 22 and 38 are not exposed. As a result of the dry etching, side surfaces 48a and 48b for the ridge structure are formed so as to be substantially perpendicular to the main surface 10a.

Referring to FIGS. 9B and 10B, the p-type cladding layer 42, the second cladding layer 24, and the fourth cladding layer 40 are etched by a wet etching technique (depth control substep). An etchant used for this wet etching preferably has higher etching rates for the second and fourth cladding layers 24 and 40 than for the first and second etch-stop layers 22 and 38. In an example, an etchant containing hydrogen bromide can be used. The etching by the wet etching technique is stopped when the first and second etch-stop layers 22 and 38 are exposed. As a result of the etching by the wet etching technique, side surfaces 46a and 46b of the ridge structure 46A are formed. As illustrated in FIGS. 9B and 10B, the side surfaces 46a and 46b constitute a reverse mesa structure with respect to the main surface 10a and mainly include, for example, the (111) planes of InP crystals. In the first stacked semiconductor layer 4A, since the side-etching layer 26 is slowly etched, the width of the side-etching layer 26 is not substantially changed. Thus, as illustrated in FIG. 9B, a stepped structure is formed at the side-etching layer 26. As described above, the side surfaces 46a and 46b mainly include the (111) planes. That is, the angle formed by the side surfaces 46a and 46b and the main surface 10a of the n-type InP substrate 10 (or a semiconductor layer formed on the main surface 10a) is solely determined. In the embodiment, the main surface 10a of the n-type InP substrate 10 has the (001) plane. Accordingly, the width of the lower end portion (portion joined to the first etch-stop layer 22) of the ridge structure 46A is solely determined by the width of the side-etching layer 26 (that is, the width of the second etching mask M2) and the thickness of the second cladding layer 24. For this reason, by adjusting the width of the second etching mask M2 and the thickness of the second cladding layer 24, the width of the ridge structure 46A can be accurately controlled.

Subsequent Steps

As a result of the above-described steps, a substrate product in which the ridge structure 46A is formed in the first and second stacked semiconductor layers 4A and 6A is produced. FIGS. 11A to 13B are explanatory views for subsequent steps (step S20 in FIG. 1) for the substrate product. FIGS. 11A to 13A illustrate sections corresponding to sections taken along line III-III in FIG. 8. The steps are similarly performed for sections taken along line IV-IV in FIG. 8. FIG. 13B illustrates a section taken along line V-V in FIG. 13A.

Figure 11A:
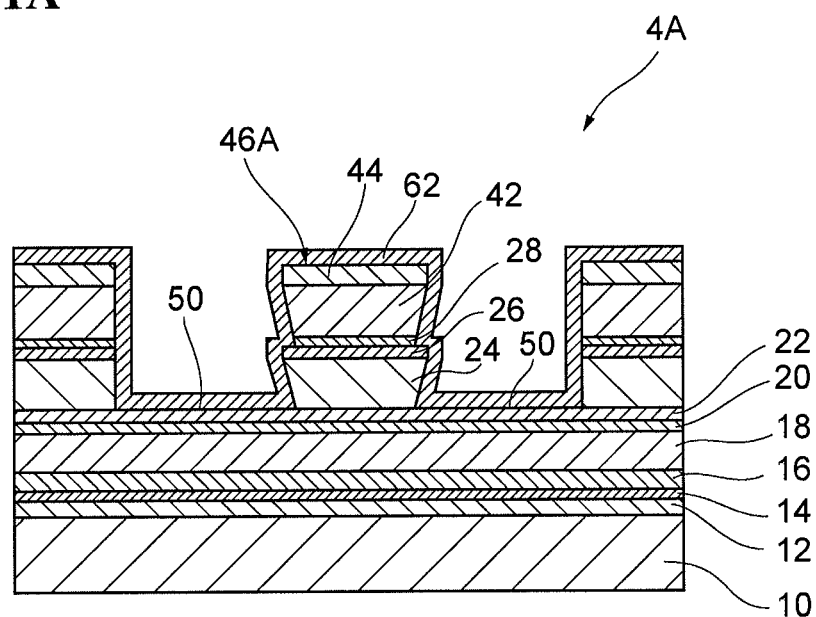
FIGS. 11A and 11B are explanatory views for subsequent steps for a substrate product.

The subsequent steps are performed in the following manner. Referring to FIG. 11A, a protective film (passivation film) 62 for protecting the first and second stacked semiconductor layers 4A and 6A is formed on the surfaces of the first and second stacked semiconductor layers 4A and 6A. At this time, for example, the protective film 62 is constituted by a dielectric film made of, for example, SiO$_2$ or SiN. The protective film 62 is formed by a CVD method. The protective film 62 is formed so as to cover at least the upper surface and side surfaces of the ridge structure 46A.

Figure 11B:
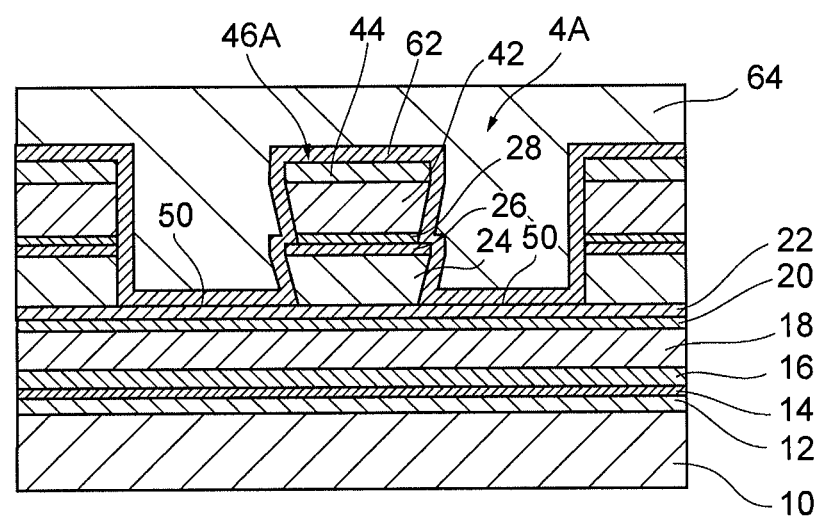

Referring to FIG. 11B, for example, a bisbenzocyclobutene (BCB) resin is then applied to the surfaces of the first and second stacked semiconductor layers 4A and 6A by spin coating to form a resin layer 64. The resin layer 64 is then heat-treated to be cured. As a result of this step, the grooves 50 formed on the lateral sides of the ridge structure 46A are filled with the resin layer 64. Thus, the resin layer 64 provides a flat surface for the substrate product. The resin layer 64 may be formed of a photosensitive BCB resin.

Figure 12A:
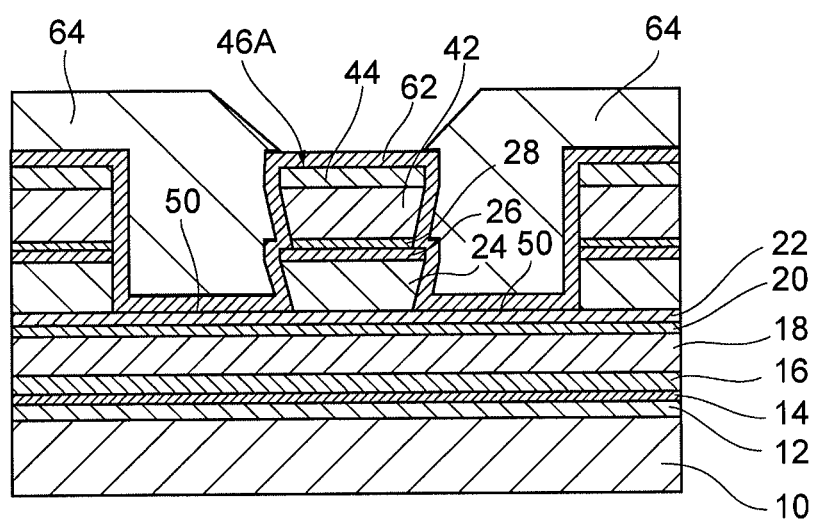
FIGS. 12A and 12B are explanatory views for subsequent steps for a substrate product.

Referring to FIG. 12A, the resin layer 64 is then exposed and developed by a photolithography technique to remove a portion of the resin layer 64 above the ridge structure 46A. As a result of this step, the protective film 62 on the ridge structure 46A is exposed.

Figure 12B:
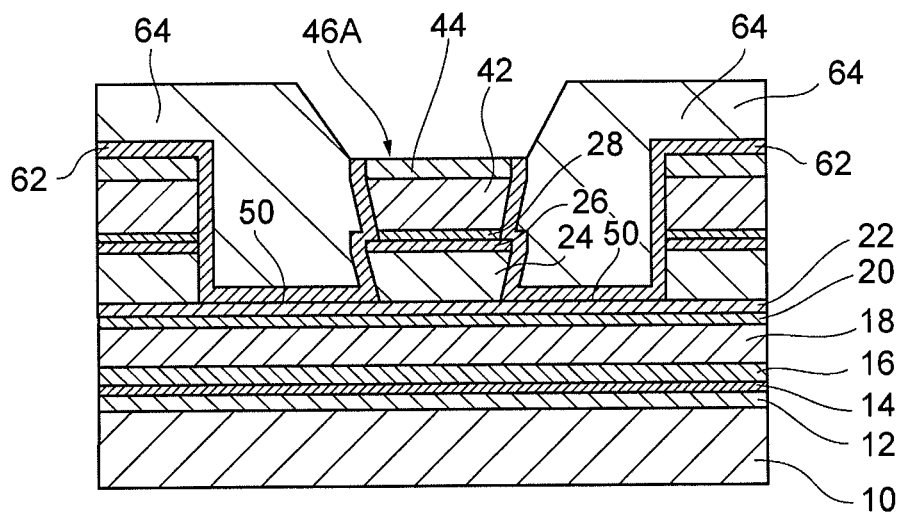

Referring to FIG. 12B, the protective film 62 on the ridge structure 46A is then removed by etching with the resin layer 64 serving as a mask. At this time, the protective film 62 is etched by a dry etching process with, for example, a CF-based gas. As a result of this step, the upper surface of the ridge structure 46A (p-type contact layer 44) is exposed.

Figure 13A:
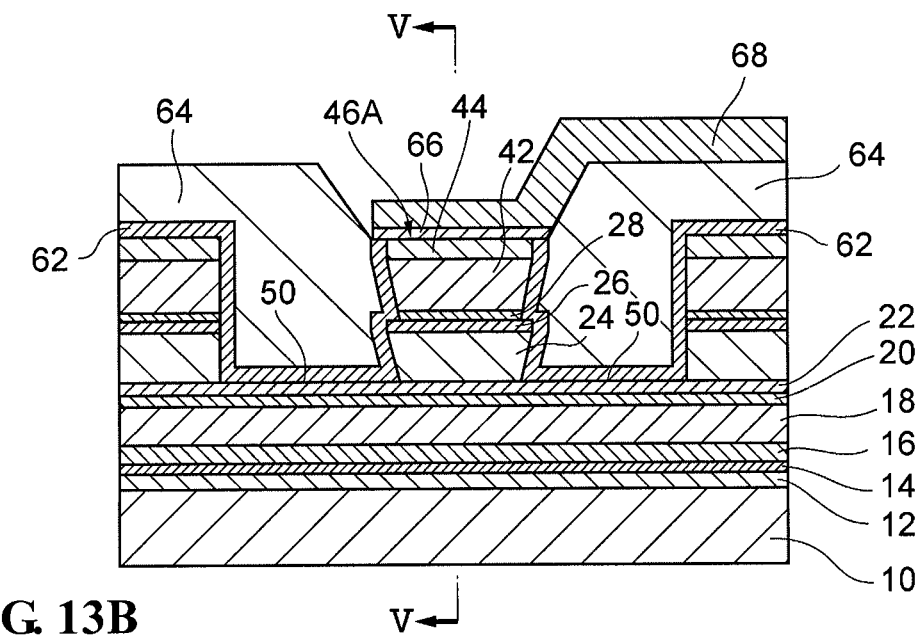
FIGS. 13A and 13B are explanatory views for subsequent steps for a substrate product.
Figure 13B:
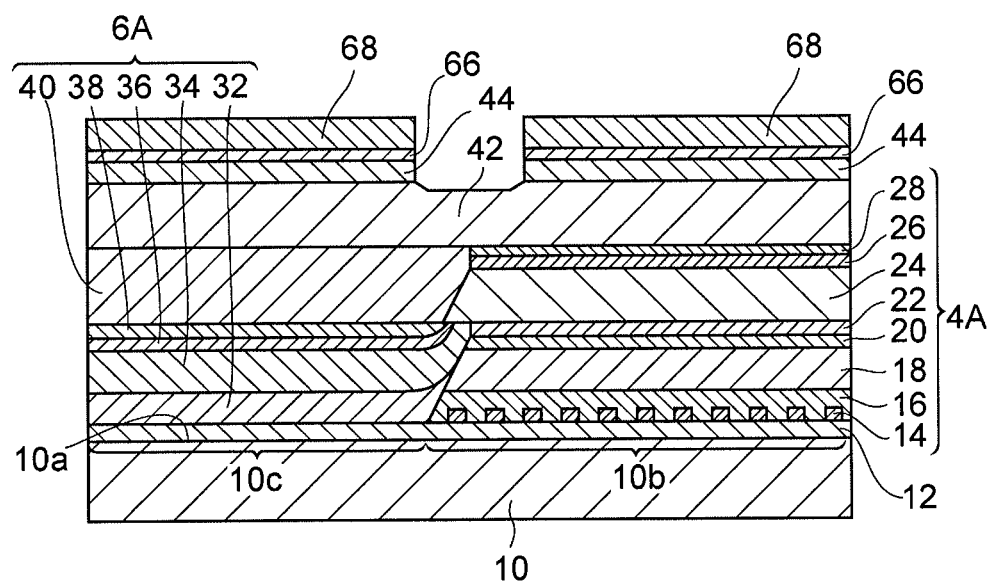

Referring to FIGS. 13A and 13B, an ohmic electrode 66 is then formed on the ridge structure 46A. In addition, a metal wire 68 is continuously formed on the ohmic electrode 66 and the resin layer 64. Referring to FIG. 13B, in order to electrically separate the ohmic electrode 66 and the metal wire 68 on the first stacked semiconductor layer 4A from the ohmic electrode 66 and the metal wire 68 on the second stacked semiconductor layer 6A, portions of the ohmic electrode 66 and the metal wire 68 are removed by etching. In addition, a portion of the p-type contact layer 44 is removed by etching to achieve separation between the p-type contact layer 44 on the first stacked semiconductor layer 4A and the p-type contact layer 44 on the second stacked semiconductor layer 6A.

After the above-described steps are performed, the resultant substrate product is divided into chips to complete integrated optical devices.

In the above-described production method according to the first embodiment, the first stacked semiconductor layer 4A grown in the first growth step S13 includes the first etch-stop layer 22. The first etch-stop layer 22 is a semiconductor layer different in composition from the first cladding layer 20 and the second cladding layer 24 and is positioned between the first cladding layer 20 and the second cladding layer 24. Regarding the first etching step S15, the compositions of the semiconductor layers and an etchant are selected so that the etching rate for the first etch-stop layer 22 in wet etching is higher than the etching rates for the overlying and underlying layers (first and second cladding layers 20 and 24). As a result, an overhang is formed between the first cladding layer 20 and the second cladding layer 24 (refer to the portion A2 in FIG. 5B). During growth of the second optical waveguiding layer 34 in the second growth step S16, this overhang suppresses rising up of the second optical waveguiding layer 34 in a region near the boundary between the second optical waveguiding layer 34 and the first stacked semiconductor layer 4A (refer to the portion A2 in FIG. 6B). As a result, in the formation of the ridge structure 46A in the second etching step S19, as illustrated in FIG. 8, formation of raised portions in regions adjacent to the side surfaces of the ridge structure 46A (the regions are specifically bottom surfaces of the grooves 50) can be suppressed and the flatness of these regions can be enhanced. Therefore, by using the method for producing an integrated optical device according to the first embodiment, disturbance in the optical waveguide mode can be suppressed. Furthermore, lasing characteristics of the semiconductor laser can be improved.

Second Embodiment

Figure 14:
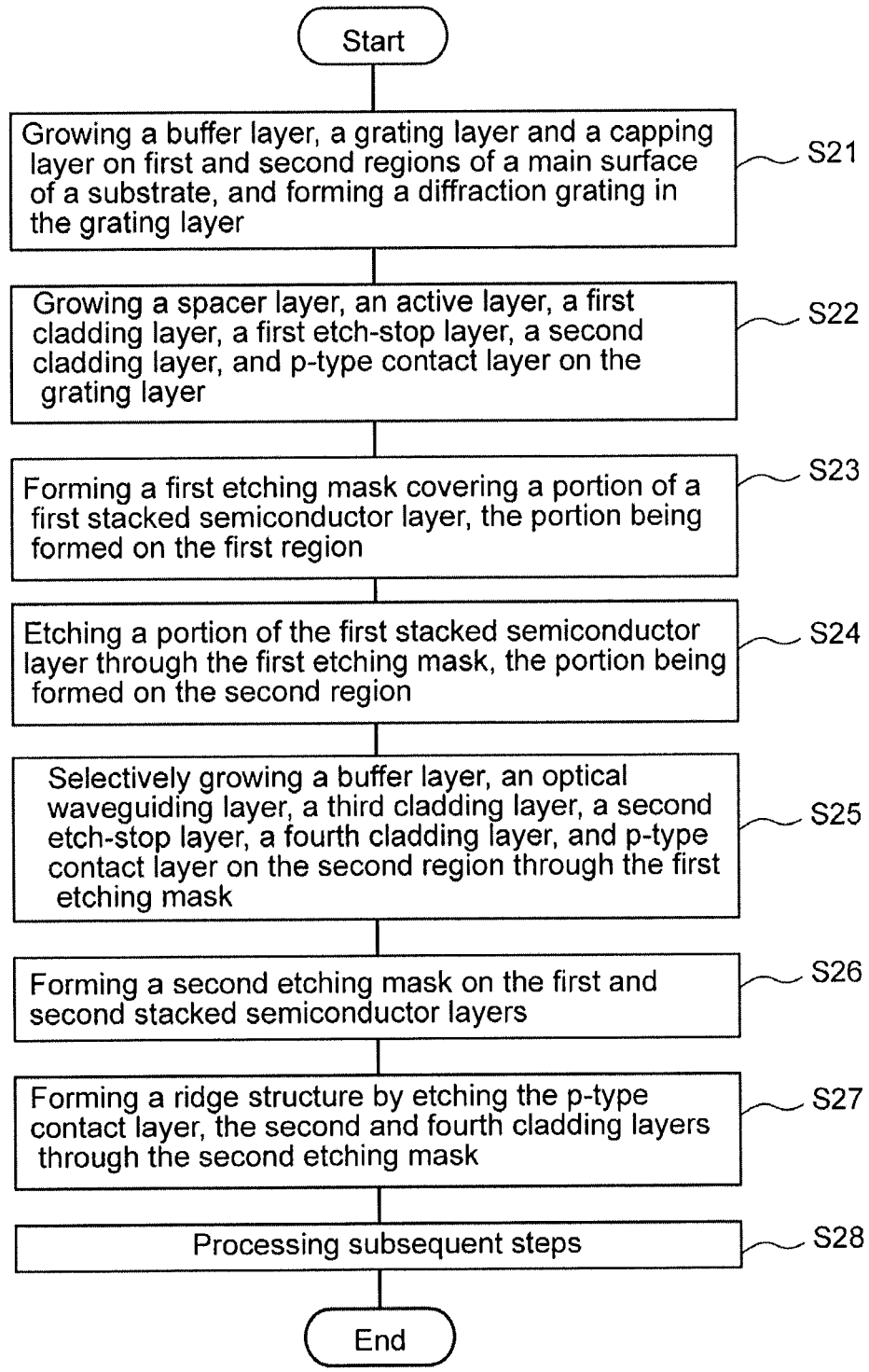
FIG. 14 is a flow chart of a method for producing an integrated optical device according to a second embodiment of the present invention.

FIG. 14 is a flow chart of a method for producing an integrated optical device according to a second embodiment of the present invention. FIGS. 15A to 20B are perspective views and sectional views illustrating the steps in FIG. 14.

<First Growth Step>

In this production method, the same n-type InP substrate 10 as in FIG. 2A is prepared. In the same manner as in the first embodiment, a buffer layer 12 and a grating layer 14 are grown on a main surface 10a of the n-type InP substrate 10. After that, a diffraction grating is formed in the grating layer 14 (refer to step S21 in FIG. 14 and FIG. 3).

Figure 15A:
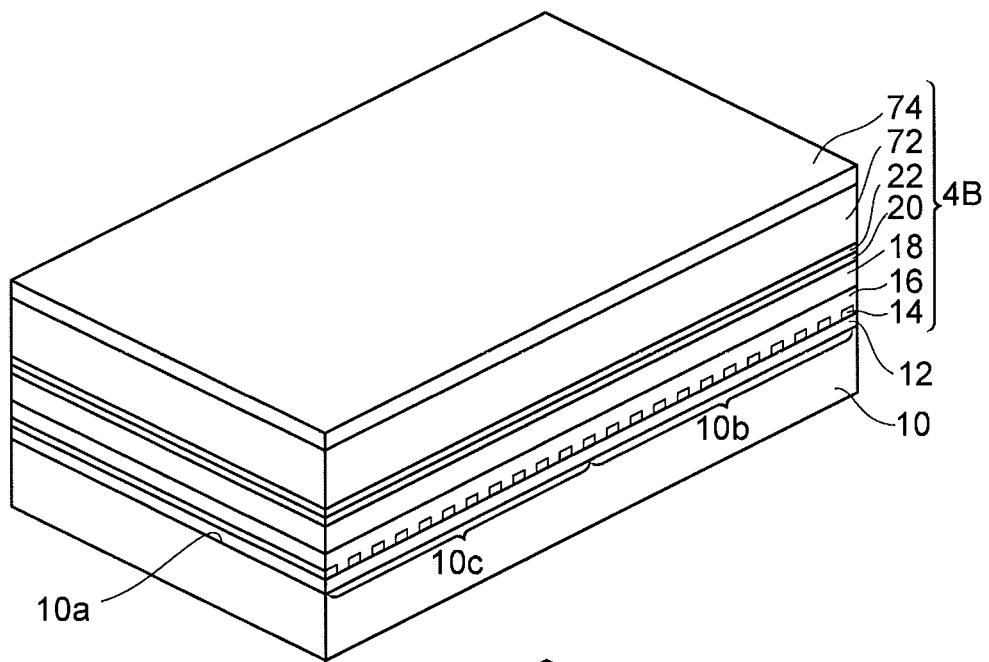
FIG. 15A illustrates a first growth step.

Referring to FIG. 15A, on the grating layer 14 in which the diffraction grating is formed, a spacer layer 16, an active layer 18, a first cladding layer 20, a first etch-stop layer 22, a second cladding layer 72 (thickness: 1800 nm), and a p-type contact layer 74 (thickness: 100 nm) are grown in this order (step S22 in FIG. 14). The structures, compositions, thicknesses, and impurity concentrations of the spacer layer 16, the active layer 18, the first cladding layer 20, and the first etch-stop layer 22 are the same as in the first embodiment above. The second cladding layer 72 has the same composition as the second cladding layer 24 in the first embodiment. The p-type contact layer 74 is positioned on the second cladding layer 72 and different in composition from the second cladding layer 72. The p-type contact layer 74 is to form an ohmic contact with an anode electrode (metal electrode). In the second embodiment, the p-type contact layer 74 is formed of a material (such as p-type InGaAs) allowing etching selectivity with respect to the second cladding layer 72. The second cladding layer 72 has an impurity concentration of, for example, $5 \times 10^{17}$ cm$^{-3}$. The p-type contact layer 74 has an impurity concentration of, for example, $1.5 \times 10^{19}$ cm$^{-3}$.

As a result of the above-described steps, a first stacked semiconductor layer 4B illustrated in FIG. 15A is formed on the main surface 10a of the n-type InP substrate 10. The first stacked semiconductor layer 4B includes the grating layer 14, the spacer layer 16, the active layer 18, the first cladding layer 20, the first etch-stop layer 22, the second cladding layer 72, and the p-type contact layer 74. A portion of the first stacked semiconductor layer 4B, the portion being formed on the first region 10b, functions as a distributed feedback (DFB) laser diode.

<First Etching Step>

Figure 15B:
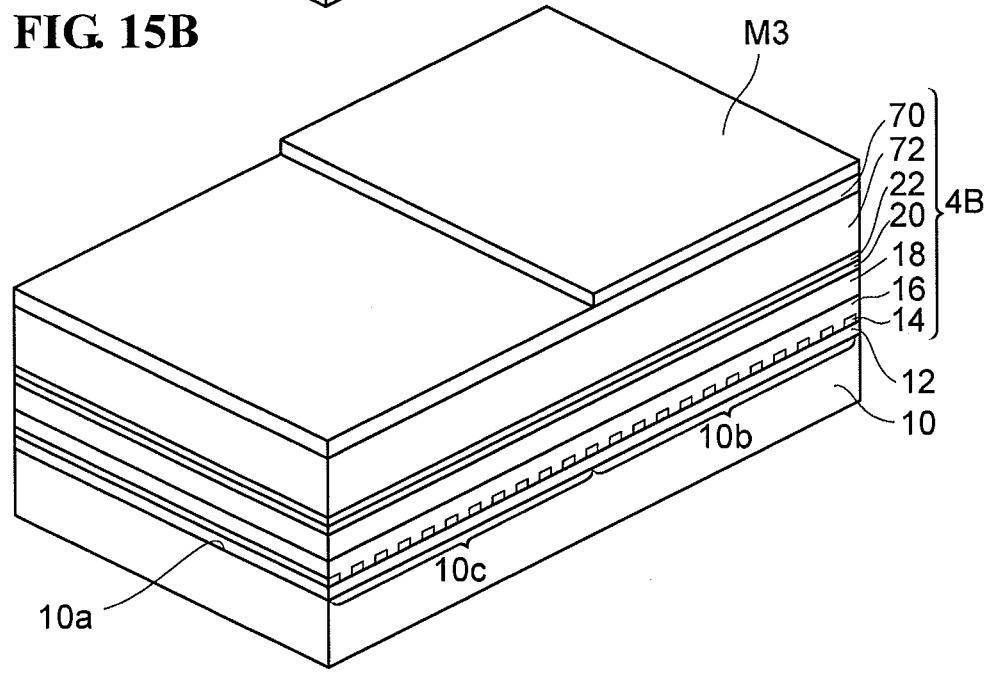
FIG. 15B illustrates a first etching step.

Referring to FIG. 15B, a first etching mask M3 covering a portion of the first stacked semiconductor layer 4B, the portion being formed on the first region 10b, is then formed on the first stacked semiconductor layer 4B (step S23 in FIG. 14). The first etching mask M3 is formed of the same material and in the same manner as in the first etching mask M1 in the first embodiment.

Figure 16A:
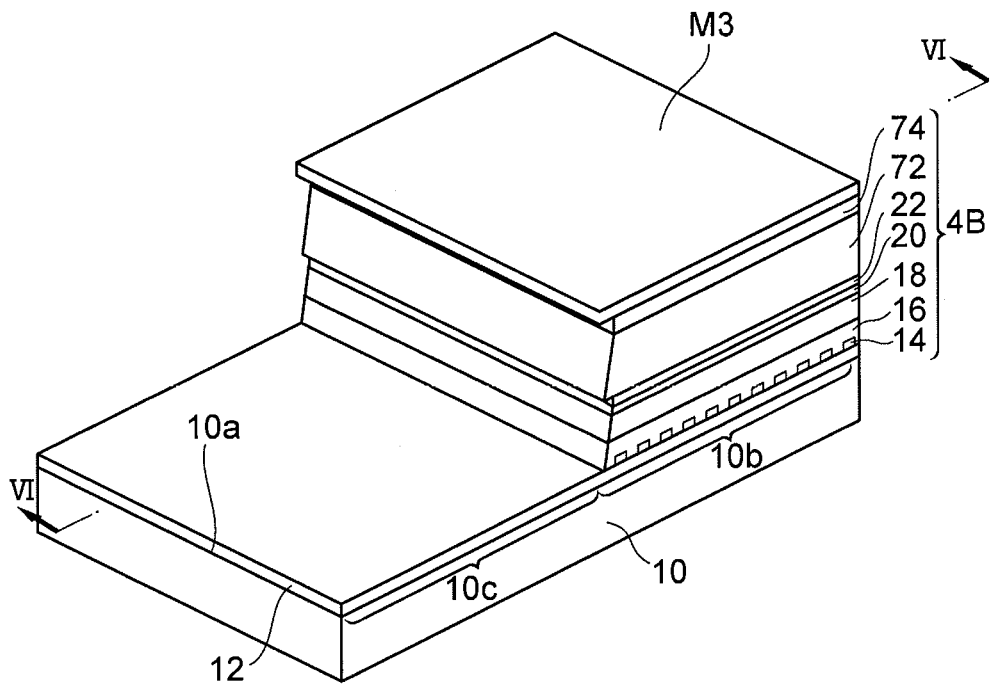
FIGS. 16A and 16B illustrate a first etching step.

Referring to FIG. 16A, a portion of the first stacked semiconductor layer 4B, the portion being grown on the second region 10c, is then etched through the first etching mask M3 by a wet etching technique. As a result, the active layer 18 is exposed (step S24 in FIG. 14). At this time, etching is performed with different etchants selected for semiconductor layers of the first stacked semiconductor layer 4B until, for example, the buffer layer 12 is exposed. In particular, the p-type contact layer 74 and the first etch-stop layer 22 are etched by a wet etching technique with an etchant having a higher etching rate for these layers than for the second cladding layer 72 and the first cladding layer 20.

In an example, an etchant containing hydrogen bromide is used for etching the second cladding layer 72, the first cladding layer 20, and the spacer layer 16 that are mainly formed of InP. Another etchant containing sulfuric acid and hydrogen peroxide is used for etching the p-type contact layer 74 mainly formed of InGaAs and the first etch-stop layer 22 mainly formed of InGaAsP. As a result, these layers can be etched faster than the second cladding layer 72 and the first cladding layer 20. The active layer 18 and the grating layer 14 that are mainly formed of InGaAsP are preferably etched with an etchant containing hydrochloric acid and hydrogen peroxide.

Figure 16B:
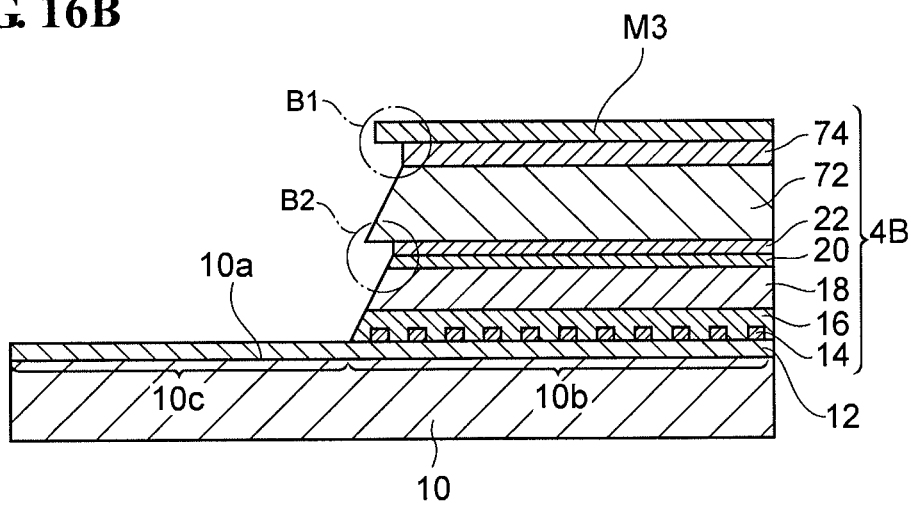

FIG. 16B is a sectional side view illustrating a section taken along line VI-VI in FIG. 16A. In the second embodiment, the etched end surface of the first stacked semiconductor layer 4B is also mainly constituted by the (111) planes of InP-based semiconductors and has a normal mesa structure. When the p-type contact layer 74 is etched, the etching rate for the p-type contact layer 74 is higher than that for the second cladding layer 72. Accordingly, the end surface of the p-type contact layer 74 is etched farther in than the end surface of the second cladding layer 72. As a result, as illustrated in a portion B1 in FIG. 16B, an overhang constituted by the first etching mask M3 is formed between the first etching mask M3 and the second cladding layer 72. Similarly, when the first etch-stop layer 22 is etched, the etching rate for the first etch-stop layer 22 is higher than those for the second cladding layer 72 and the first cladding layer 20. Accordingly, the end surface of the first etch-stop layer 22 is etched farther in than the end surfaces of the second cladding layer 72 and the first cladding layer 20. As a result, as illustrated in a portion B2 in FIG. 16B, another overhang constituted by the second cladding layer 72 is formed between the second cladding layer 72 and the first cladding layer 20. The overhang constituted by the second cladding layer 72 and formed between the second cladding layer 72 and the first cladding layer 20 serves as a first overhang in the second embodiment. The overhang constituted by the first etching mask M3 and formed between the first etching mask M3 and the second cladding layer 72 serves as a third overhang in the second embodiment.

<Second Growth Step>

Figure 17A:
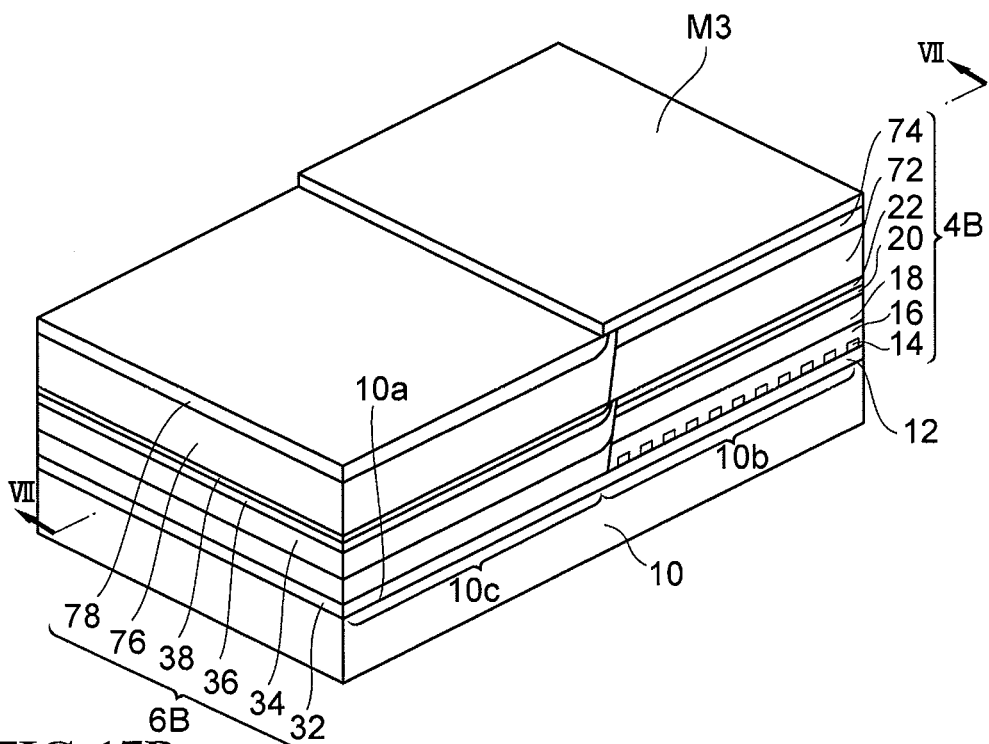
FIGS. 17A and 17B illustrate a second growth step.

Referring to FIG. 17A, on the second region 10c of the main surface 10a of the n-type InP substrate 10, a buffer layer 32, an optical waveguiding layer 34, a third cladding layer 36, a second etch-stop layer 38, a fourth cladding layer 76 (its thickness is adjusted such that the fourth cladding layer 76 is flush with the upper surface of the second cladding layer 72), and a p-type contact layer 78 (thickness: 100 nm) are selectively grown through the first etching mask M3 (step S25 in FIG. 14). The structures, compositions, thicknesses, and impurity concentrations of the buffer layer 32, the optical waveguiding layer 34, the third cladding layer 36, and the second etch-stop layer 38 are the same as in the first embodiment above.

The fourth cladding layer 76 has the same composition as the fourth cladding layer 40 in the first embodiment. The p-type contact layer 78 is constituted by a semiconductor layer that is positioned on the fourth cladding layer 76 and is different in composition from the fourth cladding layer 76. The p-type contact layer 78 is to form an ohmic contact with an anode electrode (metal electrode). The p-type contact layer 78 is formed of, for example, p-type InGaAs. The fourth cladding layer 76 has an impurity concentration of, for example, $5 \times 10^{17}$ cm$^{-3}$. The p-type contact layer 78 has an impurity concentration of for example, $1.5 \times 10^{19}$ cm$^{-3}$.

Figure 17B:
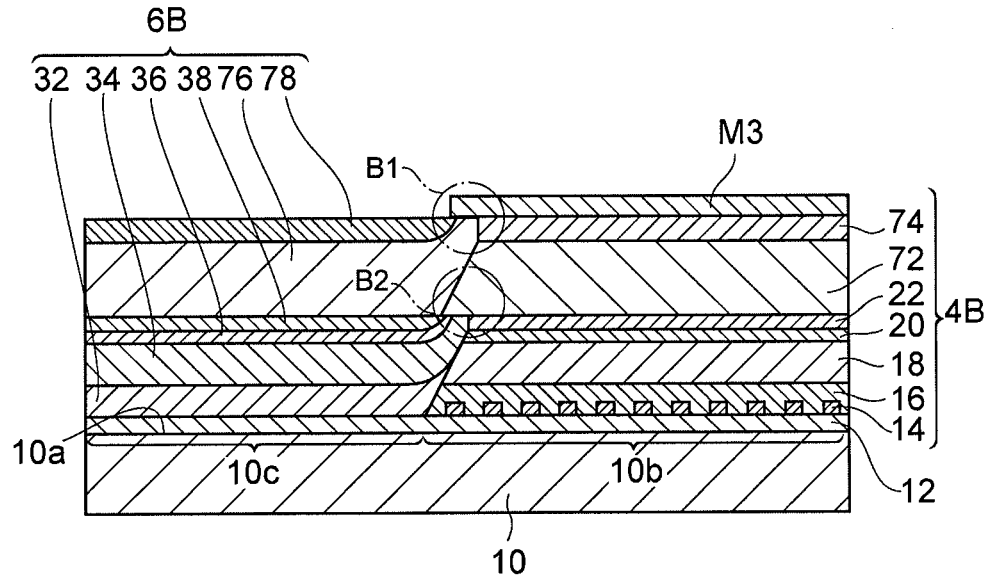

FIG. 17B is a sectional side view illustrating a section taken along line VII-VII in FIG. 17A. As a result of the above-described first etching step, an overhang constituted by the first etching mask M3 is formed (portion B1 in FIG. 17B) between the second cladding layer 72 and the first etching mask M3. During growth of the fourth cladding layer 76 in the second growth step, this overhang effectively suppresses rising up of the fourth cladding layer 76 in a region near the boundary between the fourth cladding layer 76 and the first stacked semiconductor layer 4B. In addition, as a result of the above-described first etching step, another overhang constituted by the second cladding layer 72 is formed (portion B2 in FIG. 17B) between the first cladding layer 20 and the second cladding layer 72. During growth of the second optical waveguiding layer 34 in the second growth step, this overhang effectively suppresses rising up of the second optical waveguiding layer 34 in a region near the boundary between the second optical waveguiding layer 34 and the first stacked semiconductor layer 4B.

As a result of the above-described steps, a second stacked semiconductor layer 6B illustrated in FIGS. 17A and 17B is formed on the main surface 10a of the n-type InP substrate 10. The second stacked semiconductor layer 6B includes the buffer layer 32, the optical waveguiding layer 34, the third cladding layer 36, the second etch-stop layer 38, the fourth cladding layer 76, and the p-type contact layer 78. The second stacked semiconductor layer 6B functions as, for example, an EA optical modulator. The first etching mask M3 is then removed with, for example, hydrofluoric acid.

<Second Etching Step>

Figure 18A:
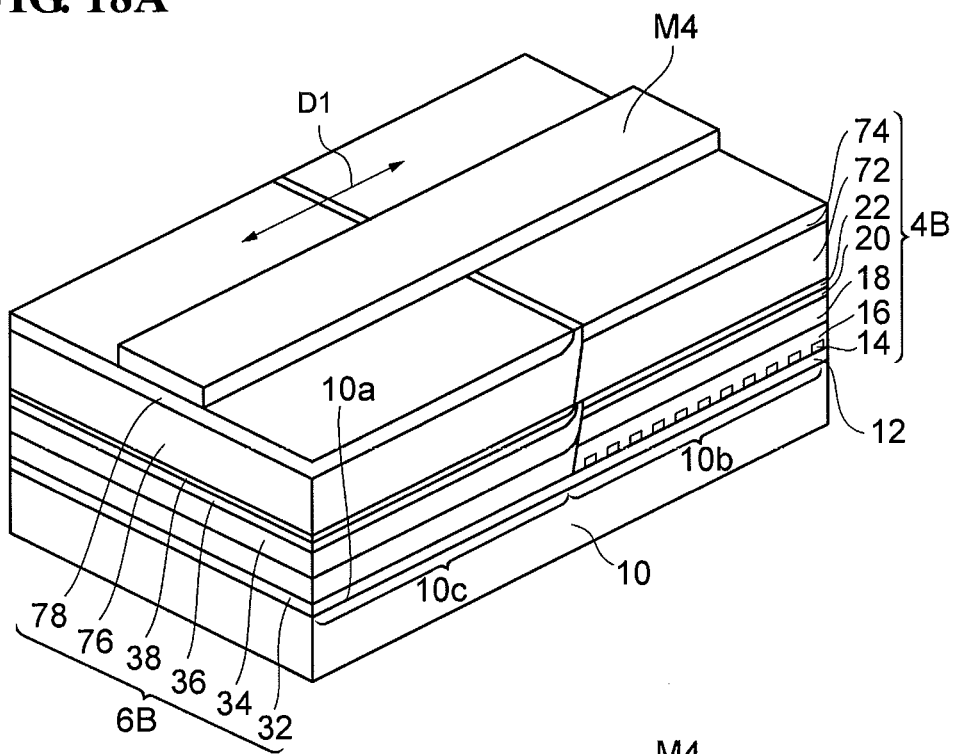
FIGS. 18A and 18B illustrate a second etching step.
Figure 18B:
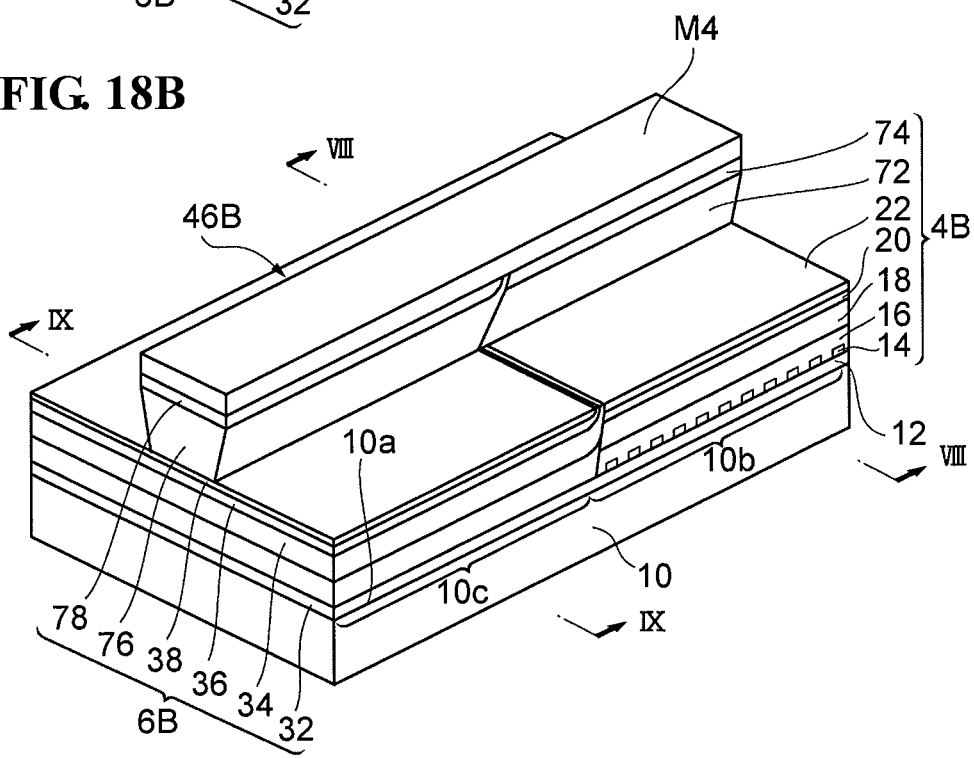

Referring to FIG. 18A, a second etching mask M4 longitudinally extending in the predetermined direction D1 is then formed on the first stacked semiconductor layer 4B and the second stacked semiconductor layer 6B (step S26 in FIG. 14). The second etching mask M4 has the shape of a stripe. The second etching mask M4 is formed of the same material and in the same manner as in the second etching mask M2 in the first embodiment. Referring to FIG. 18B, the p-type contact layers 74 and 78, the second cladding layer 72, and the fourth cladding layer 76 are etched through the second etching mask M4 to form a ridge structure 46B (step S27 in FIG. 14).

Figure 19A:
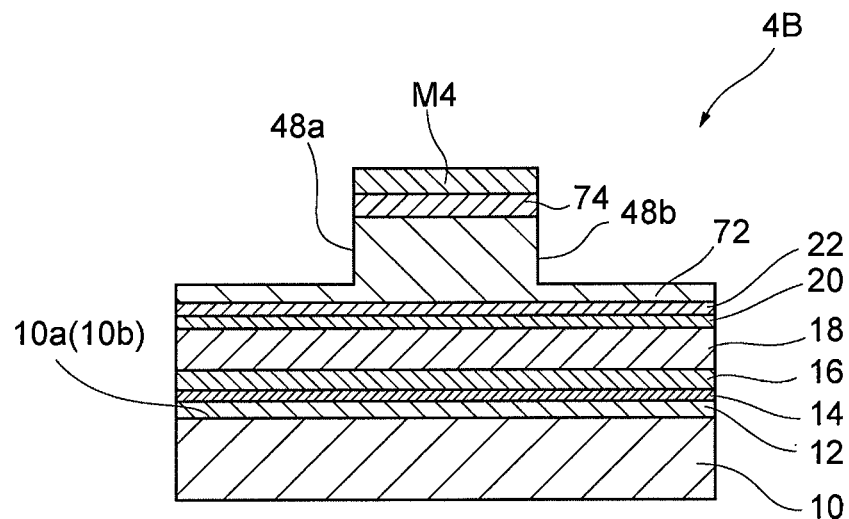
FIGS. 19A and 19B specifically illustrate a second etching step.
Figure 19B:
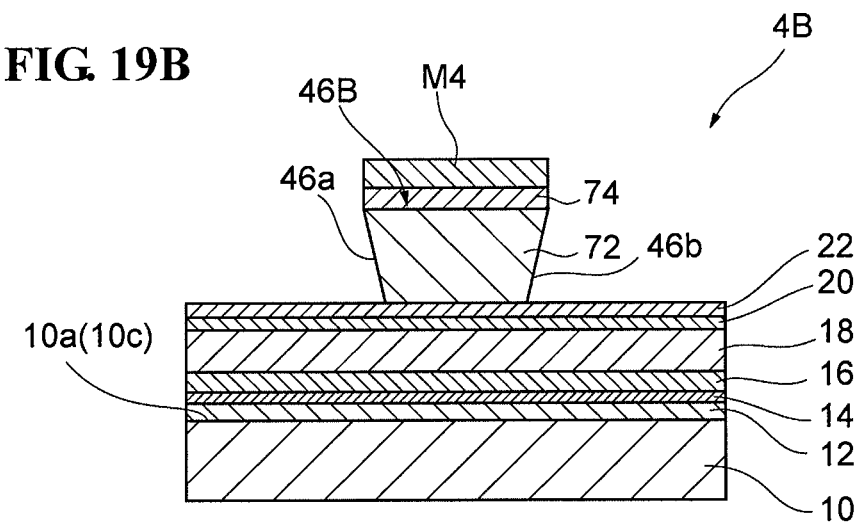
Figure 20A:
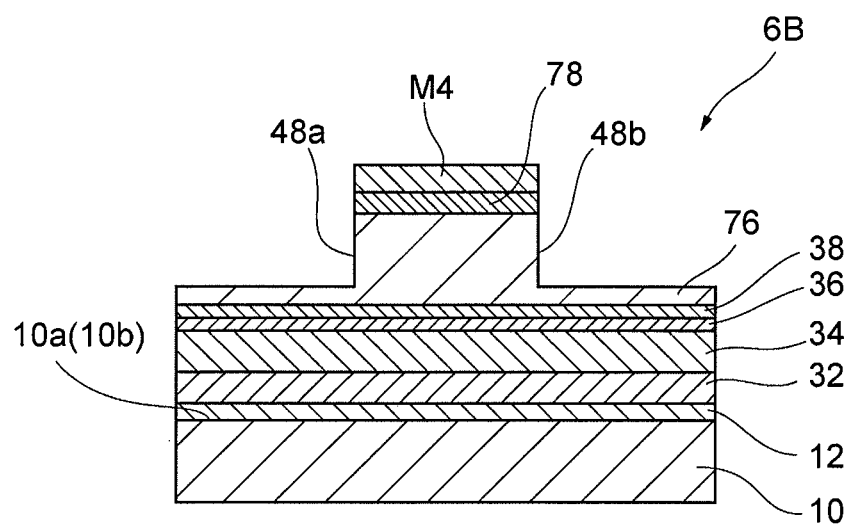
FIGS. 20A and 20B specifically illustrate a second etching step.
Figure 20B:
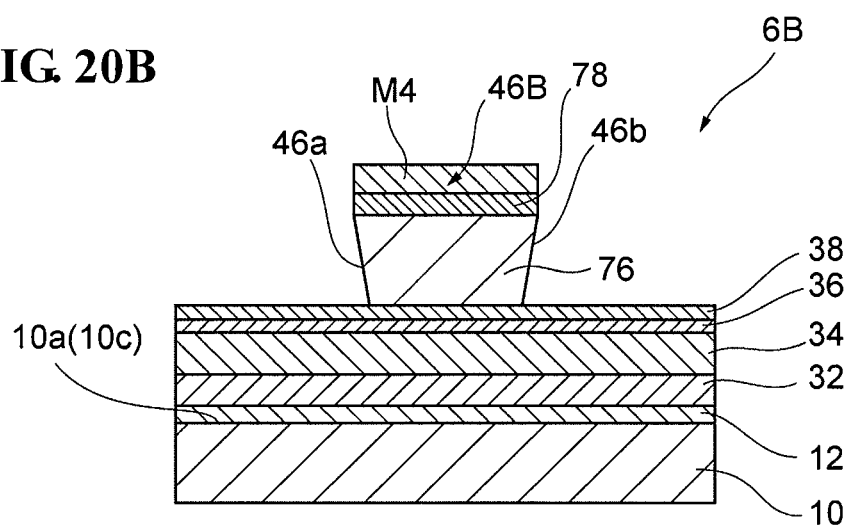

FIGS. 19A, 19B, 20A, and 20B specifically illustrate the second etching step illustrated in FIG. 18B. FIGS. 19A and 19B illustrate sections taken along line VIII-VIII in FIG. 18B. FIGS. 20A and 20B illustrate sections taken along line IX-IX in FIG. 18B. Referring to FIGS. 19A and 20A, in the second etching step, the p-type contact layers 74 and 78, the second cladding layer 72, and the fourth cladding layer 76 are etched by a dry etching process. An etching gas used for this dry etching may be, for example, a gas mixture of methane gas ($CH_4$) and hydrogen gas ($H_2$). This dry etching is stopped in the middle of the second cladding layer 72 and the fourth cladding layer 76. In this dry etching, the first and second etch-stop layers 22 and 38 are not exposed. As a result of the dry etching, side surfaces 48a and 48b for the ridge structure are formed so as to be substantially perpendicular to the main surface 10a.

Referring to FIGS. 19B and 20B, the p-type contact layers 74 and 78, the second cladding layer 72, and the fourth cladding layer 76 are etched by a wet etching technique (depth control substep). An etchant used for this wet etching preferably has higher etching rates for the second and fourth cladding layers 72 and 76 than for the first and second etch-stop layers 22 and 38. In an example, an etchant containing hydrogen bromide can be used. The wet etching is stopped when the first and second etch-stop layers 22 and 38 are exposed. As a result of the wet etching, side surfaces 46a and 46b of the ridge structure 46B are formed. As illustrated in FIGS. 19B and 20B, the side surfaces 46a and 46b constitute a reverse mesa structure with respect to the main surface 10a and mainly include, for example, the (111) plane of an InP crystal.

After the above-described steps are performed, the subsequent steps (step S27 in FIG. 14) as in the first embodiment are performed. The resultant substrate product is then divided into chips to complete integrated optical devices.

In the above-described production method according to the second embodiment, during the first etching step S24, the first etch-stop layer 22 is etched by wet etching faster than the overlying and underlying layers (the first and second cladding layers 20 and 72). As a result, an overhang is formed between the first cladding layer 20 and the second cladding layer 72 (refer to the portion B2 in FIG. 16B). During growth of the second optical waveguiding layer 34 in the second growth step S25, this overhang suppresses rising up of the second optical waveguiding layer 34 in a region near the boundary between the second optical waveguiding layer 34 and the first stacked semiconductor layer 4B (refer to the portion B2 in FIG. 17B). As a result, in the formation of the ridge structure 46B in the second etching step S27, as illustrated in FIG. 18B, formation of raised portions in regions adjacent to the side surfaces of the ridge structure 46B can be suppressed and the flatness of these regions can be enhanced. Therefore, by using the method for producing an integrated optical device according to the second embodiment, disturbance in the optical waveguide mode can be suppressed. Furthermore, lasing characteristics of the semiconductor laser can be improved.

In the production method according to the second embodiment, the first stacked semiconductor layer 4B grown in the first growth step S22 includes the contact layer 74. In the first etching step S24, the contact layer 74 is etched by a wet etching technique with an etchant having a higher etching rate for the contact layer 74 than for the second cladding layer 72. As a result, an overhang can be formed between the second cladding layer 72 and the first etching mask M3 (refer to the portion B1 in FIG. 16B). During growth of the fourth cladding layer 76 in the second growth step S25, this overhang suppresses rising up of the fourth cladding layer 76 in a region near the boundary between the fourth cladding layer 76 and the first stacked semiconductor layer 4B (refer to the portion B1 in FIG. 17B). As a result, the flatness of the upper surfaces of the first and second stacked semiconductor layers 4B and 6B can be enhanced. Therefore, for example, electrodes can be formed on the flat surface of the first and second stacked semiconductor layers 4B and 6B in the subsequent steps.

In the production method according to the second embodiment, the overhang suppressing rising up of the fourth cladding layer 76 is formed by using the difference in etching rates for the second cladding layer 72 and the contact layer 74 that is formed for the ohmic contact with the metal electrode. Thus, formation of a semiconductor layer dedicated solely to the formation of such an overhang, between the second cladding layer 72 and the contact layer 74, is not necessary. Accordingly, in the production method according to the second embodiment, the number of production steps can be decreased. In addition, the contact layer 74 is positioned uppermost among the semiconductor layers constituting the ridge structure 46B. Accordingly, the flatness of the side surfaces 46a and 46b of the ridge structure 46B can be enhanced, compared with the case where a semiconductor layer for forming an overhang is present at an intermediate position in the second cladding layer 72 constituting the main portion of the ridge structure 46B.

Third Embodiment

Figure 21:
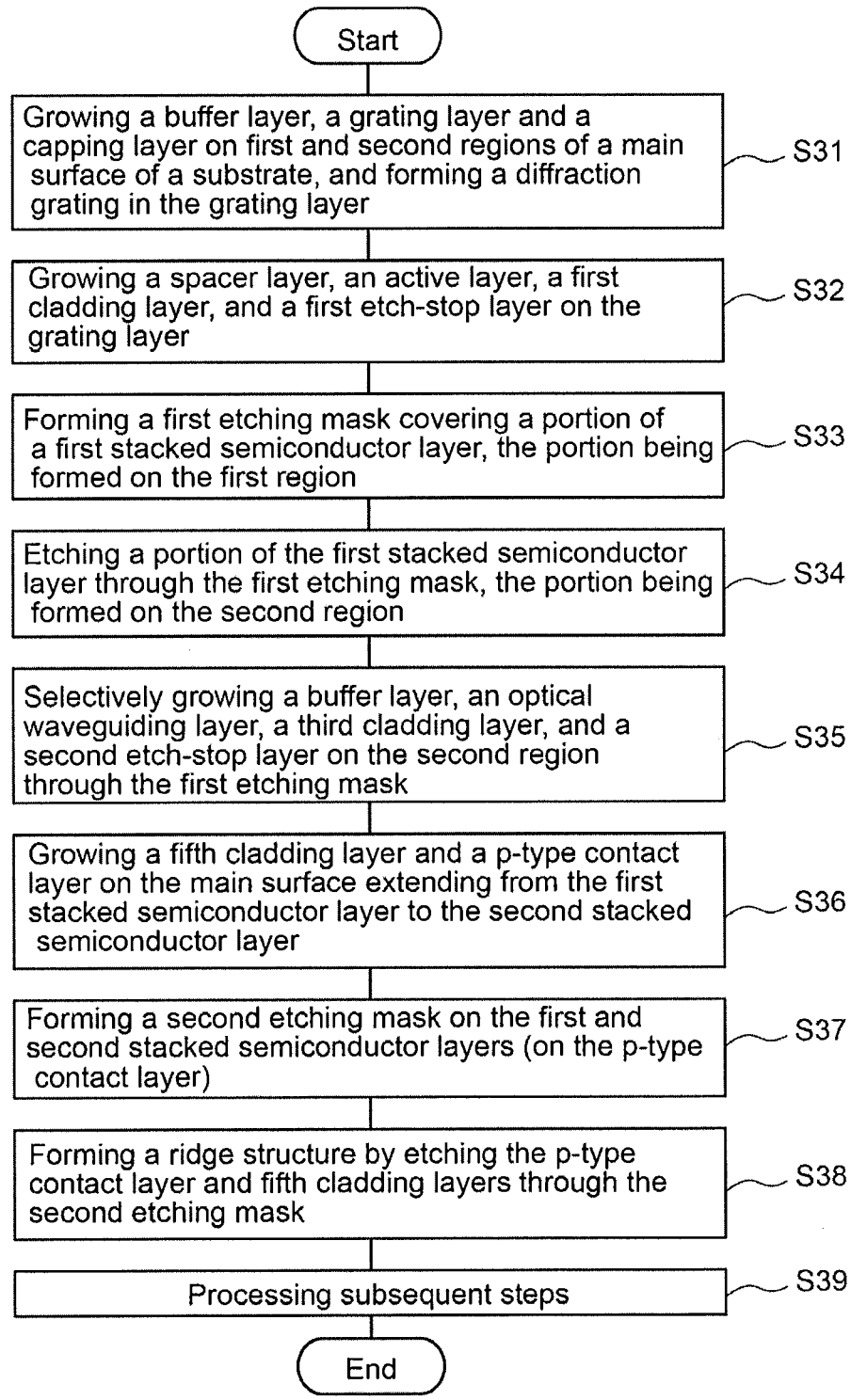
FIG. 21 is a flow chart of a method for producing an integrated optical device according to a third embodiment of the present invention.

FIG. 21 is a flow chart of a method for producing an integrated optical device according to a third embodiment of the present invention. FIGS. 22A to 27B are perspective views and sectional views illustrating the steps in FIG. 21.

<First Growth Step>

In this production method, the same n-type InP substrate 10 as in FIG. 2A is prepared. In the same manner as in the first embodiment, a buffer layer 12 and a grating layer 14 are grown on a main surface 10a of the n-type InP substrate 10. After that, a diffraction grating is formed in the grating layer 14 (refer to step S31 in FIG. 21 and FIG. 3).

Figure 22A:
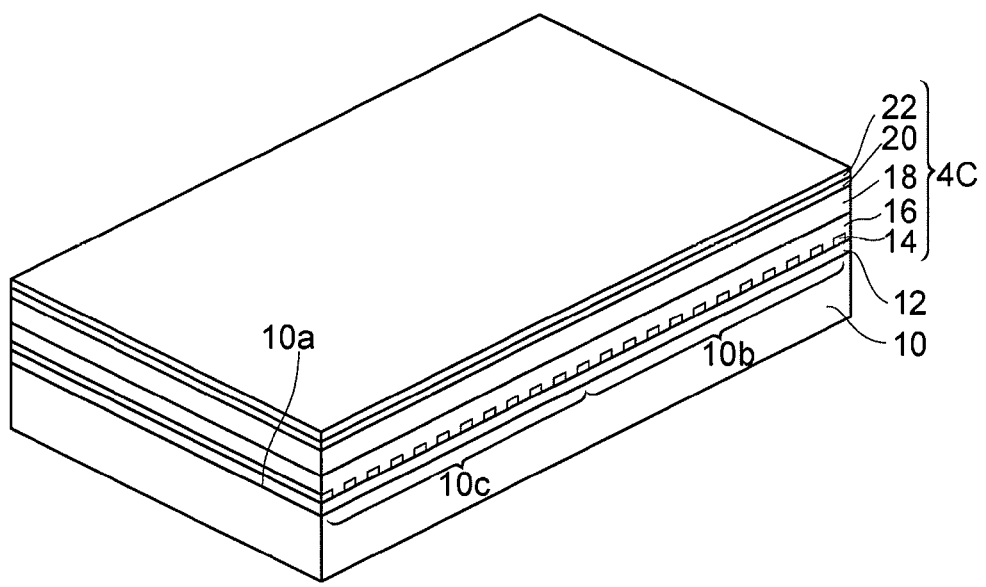
FIG. 22A illustrates a first growth step.

Referring to FIG. 22A, on the grating layer 14 in which the diffraction grating is formed, a spacer layer 16, an active layer 18, a first cladding layer 20, and a first etch-stop layer 22 are grown in this order (step S32 in FIG. 21). The structures, compositions, thicknesses, and impurity concentrations of the spacer layer 16, the active layer 18, and the first etch-stop layer 22 are the same as in the first embodiment above. Although the composition of the first cladding layer 20 is the same as in the first embodiment, the thickness thereof is different from that in the first embodiment. The thickness of the first cladding layer 20 is, for example, 150 nm or less.

As a result of the above-described steps, a first stacked semiconductor layer 4C illustrated in FIG. 22A is formed on the main surface 10a of the n-type InP substrate 10. The first stacked semiconductor layer 4C includes the grating layer 14, the spacer layer 16, the active layer 18, the first cladding layer 20, and the first etch-stop layer 22. A portion of the first stacked semiconductor layer 4C, the portion being formed on the first region 10b, functions as a distributed feedback (DFB) laser diode.

<First Etching Step>

Figure 22B:
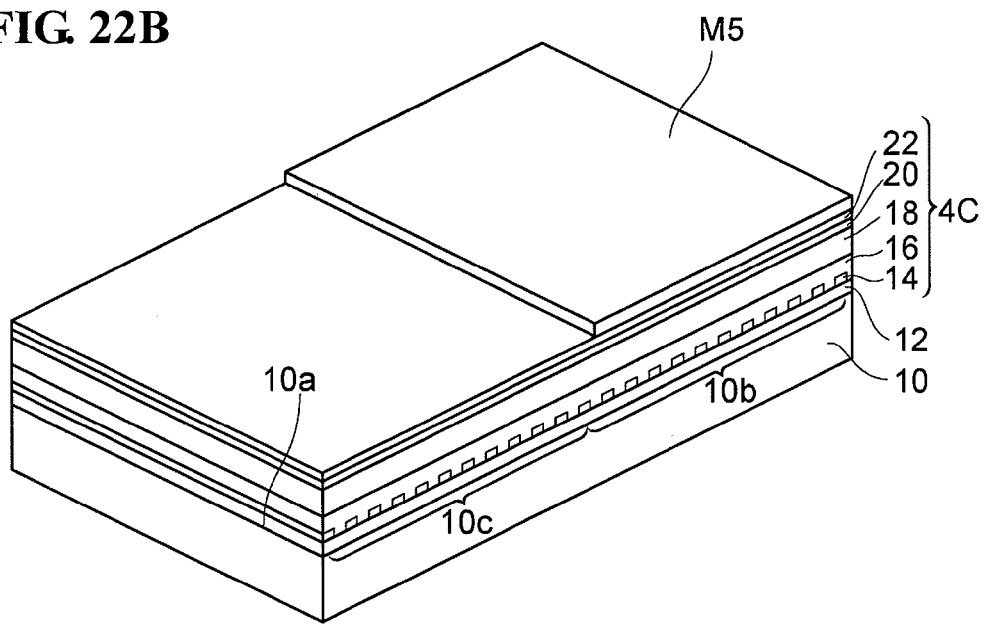
FIG. 22B illustrates a first etching step.

Referring to FIG. 22B, a first etching mask M5 covering a portion of the first stacked semiconductor layer 4C, the portion being grown on the first region 10b, is then formed on the first stacked semiconductor layer 4C (step S33 in FIG. 21). The first etching mask M5 is formed of the same material and in the same manner as in the first etching mask M1 in the first embodiment.

Figure 23A:
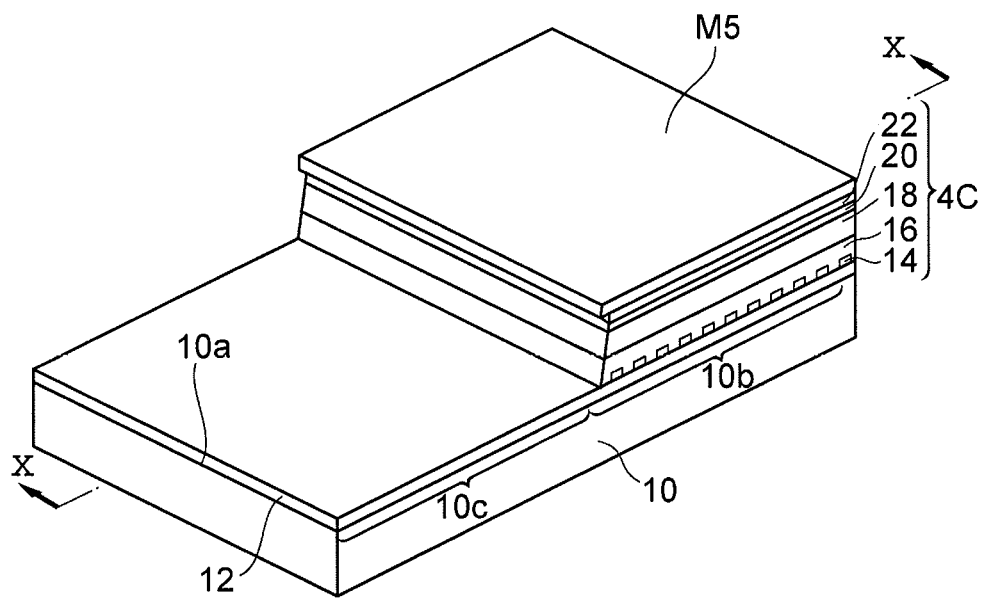
FIGS. 23A and 23B illustrate a first etching step.

Referring to FIG. 23A, a portion of the first stacked semiconductor layer 4C, the portion being grown on the second region 10c, is then etched through the first etching mask M5 by a wet etching technique. As a result of this etching, the active layer 18 is exposed (step S34 in FIG. 21). At this time, etching is performed with different etchants selected for semiconductor layers constituting the first stacked semiconductor layer 4C until, for example, the buffer layer 12 is exposed. In particular, the first etch-stop layer 22 is etched by a wet etching technique with an etchant having a higher etching rate for the first etch-stop layer 22 than for the first cladding layer 20.

In an example, an etchant containing hydrogen bromide is used for etching the first cladding layer 20 and the spacer layer 16 that are mainly formed of InP. Another etchant containing sulfuric acid and hydrogen peroxide is used for etching the first etch-stop layer 22 mainly formed of InGaAsP. As a result, the first etch-stop layer 22 can be etched faster than the first cladding layer 20. The active layer 18 and the grating layer 14 that are mainly formed of InGaAsP are preferably etched with an etchant containing hydrochloric acid and hydrogen peroxide.

Figure 23B:
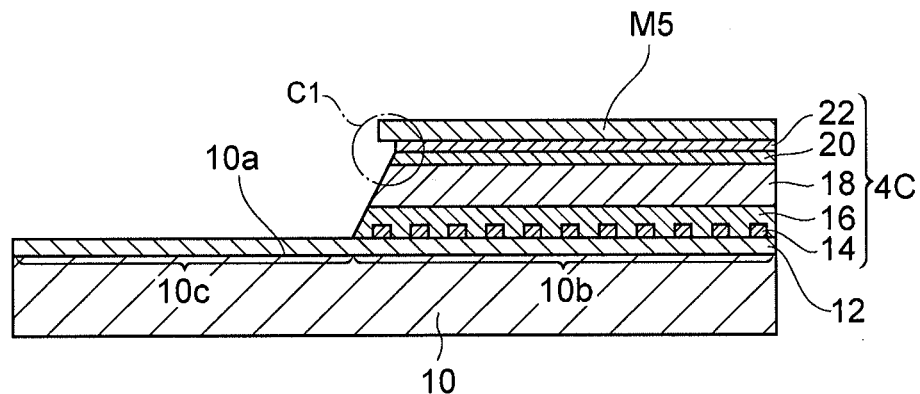

FIG. 23B is a sectional side view illustrating a section taken along line X-X in FIG. 23A. In the third embodiment, the etched end surface of the first stacked semiconductor layer 4C is also mainly constituted by the (111) planes of InP-based semiconductors and has a normal mesa structure. When the first etch-stop layer 22 is etched, the etching rate for the first etch-stop layer 22 is higher than that for the first cladding layer 20. Accordingly, the end surface of the first etch-stop layer 22 is etched farther in than the end surface of the first cladding layer 20. As a result, as illustrated in a portion C1 in FIG. 23B, an overhang constituted by the first etching mask M5 is formed between the first etching mask M5 and the first cladding layer 20 (overhang formation substep).

<Second Growth Step>

Figure 24A:
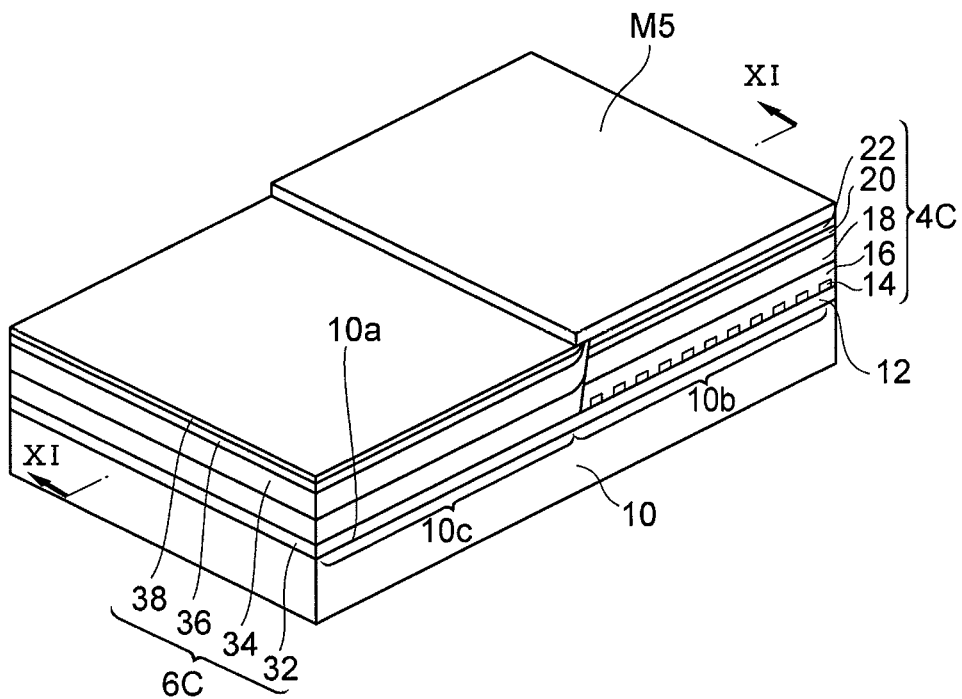
FIGS. 24A and 24B illustrate a second growth step.

Referring to FIG. 24A, on the second region 10c of the main surface 10a of the n-type InP substrate 10, a buffer layer 32, an optical waveguiding layer 34, a third cladding layer 36, and a second etch-stop layer 38 are then selectively grown through the first etching mask M5 (step S35 in FIG. 21). The structures, compositions, thicknesses, and impurity concentrations of the buffer layer 32, the optical waveguiding layer 34, and the second etch-stop layer 38 are the same as in the first embodiment above. The composition of the third cladding layer 36 is the same as in the first embodiment above and the thickness thereof is the same as in the first cladding layer 20, that is, 150 nm or less.

Figure 24B:
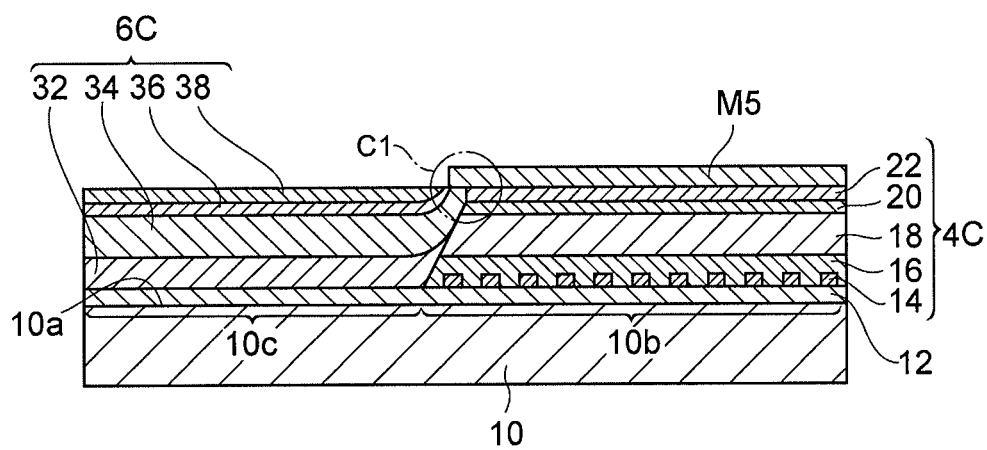

FIG. 24B is a sectional side view illustrating a section taken along line XI-XI in FIG. 24A. As a result of the above-described first etching step, an overhang constituted by the first etching mask M5 is formed (portion C1 in FIG. 24B) between the first cladding layer 20 and the first etching mask M5. During growth of the second optical waveguiding layer 34 in the second growth step, this overhang effectively suppresses rising up of the second optical waveguiding layer 34 in a region near the boundary between the second optical waveguiding layer 34 and the first stacked semiconductor layer 4C.

As described above, the third cladding layer 36 preferably has a thickness of 150 nm or less. However, when the third cladding layer 36 is formed so as to have such a small thickness, the surface of the third cladding layer 36 may have a low flatness. To avoid such a decrease in the flatness, the third cladding layer 36 is preferably grown at a growth temperature lower than that for the active layer 18. In this case, the growth rate on the (111) plane becomes higher than that on the (001) plane and generation of a roughened surface in the surface of the third cladding layer 36 can be suppressed.

As a result of the above-described steps, a second stacked semiconductor layer 6C illustrated in FIGS. 24A and 24B is formed on the main surface 10a of the n-type InP substrate 10. The second stacked semiconductor layer 6C includes the buffer layer 32, the optical waveguiding layer 34, the third cladding layer 36, and the second etch-stop layer 38. The second stacked semiconductor layer 6C functions as, for example, an EA optical modulator. The first etching mask M5 is then removed with, for example, hydrofluoric acid.

<Third Growth Step>

Figure 25A:
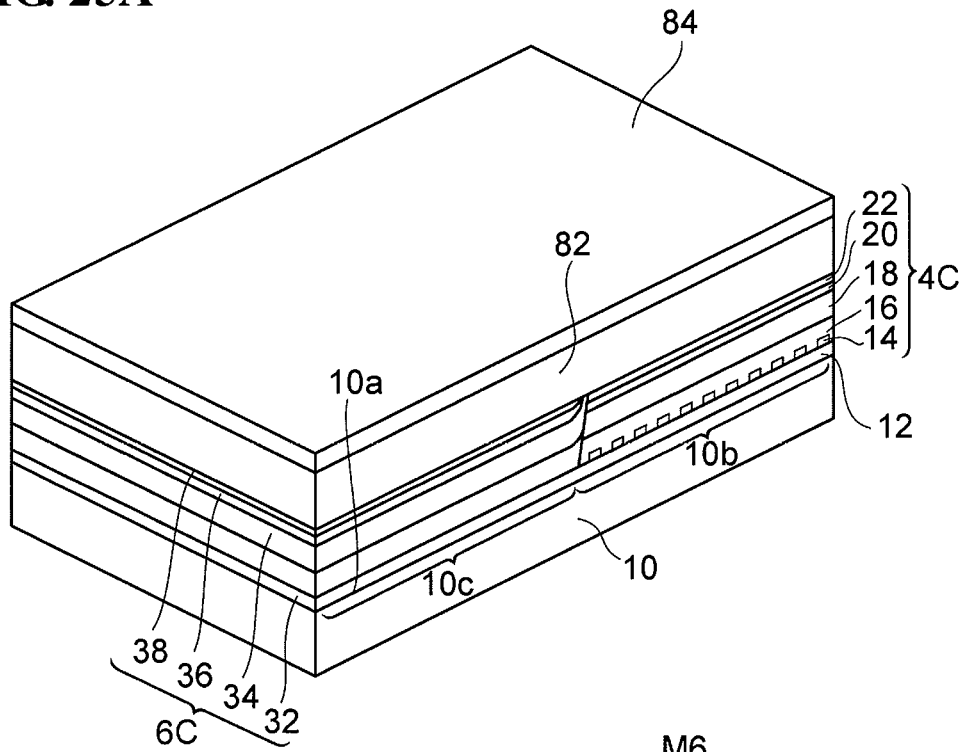
FIG. 25A illustrates a third growth step.

Referring to FIG. 25A, on the main surface 10a extending from the first stacked semiconductor layer 4C to the second stacked semiconductor layer 6C, a fifth cladding layer 82 (thickness: 1500 nm) and a p-type contact layer 84 (thickness: 100 nm) are then grown in this order (step S36 in FIG. 21). The fifth cladding layer 82 is formed of, for example, the same semiconductor material (p-type InP) as in the first cladding layer 20 and the third cladding layer 36. The p-type contact layer 84 is constituted by a semiconductor layer different in composition from the fifth cladding layer 82. The p-type contact layer 84 is to form an ohmic contact with an anode electrode (metal electrode) formed in a subsequent step. The p-type contact layer 84 is formed of, for example, p-type InGaAs. The fifth cladding layer 82 has an impurity concentration of, for example, $1 \times 10^{18}$ cm$^{-3}$. The p-type contact layer 84 has an impurity concentration of, for example, $1.5 \times 10^{19}$ cm$^{-3}$.

<Second Etching Step>

Figure 25B:
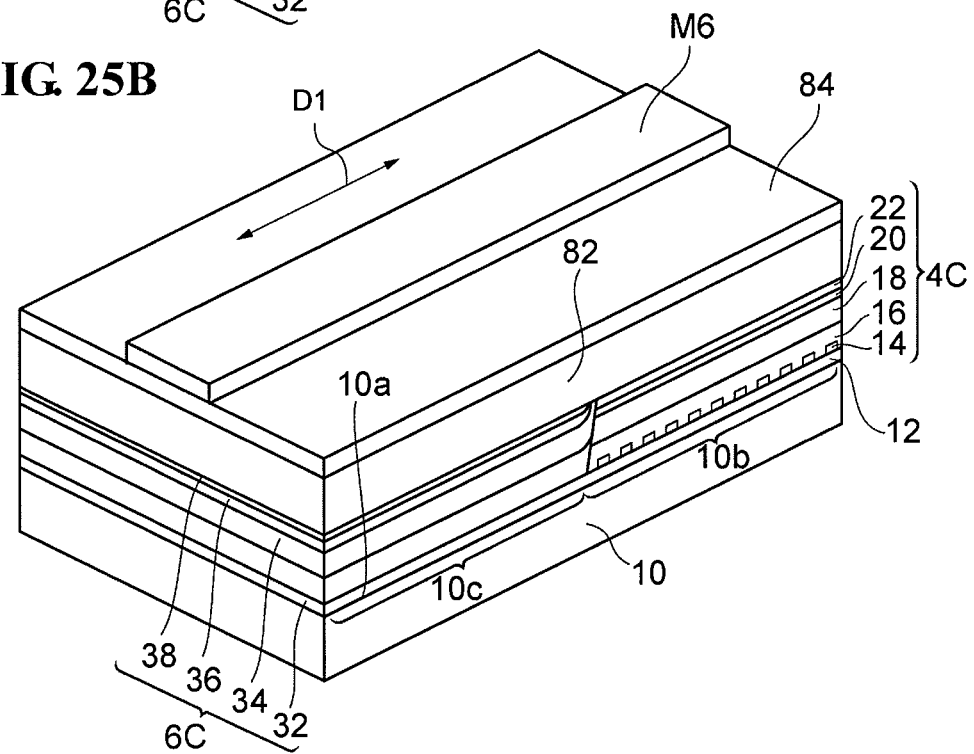
FIG. 25B illustrates a second etching step.

Referring to FIG. 25B, a second etching mask M6 longitudinally extending in the predetermined direction D1 is formed on the first stacked semiconductor layer 4C and the second stacked semiconductor layer 6C (in the third embodiment, on the p-type contact layer 84) (step S37 in FIG. 21).

Figure 26:
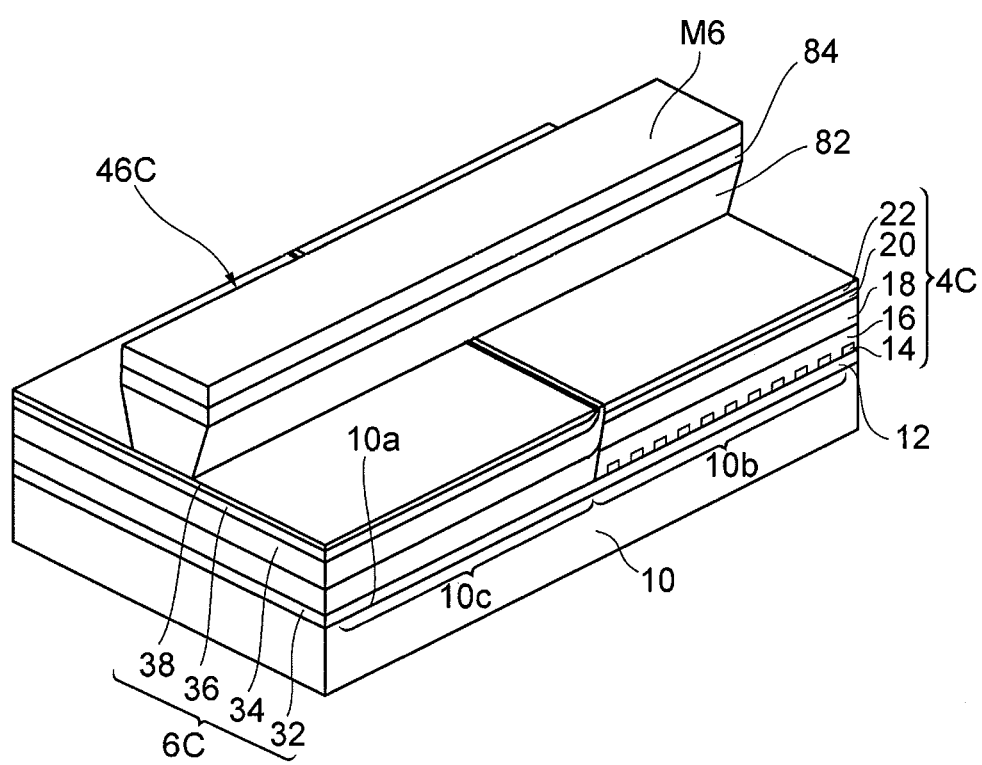
FIG. 26 illustrates a second etching step.

The second etching mask M6 has the shape of a stripe. The second etching mask M6 is formed of the same material and in the same manner as in the second etching mask M2 in the first embodiment. Referring to FIG. 26, the p-type contact layer 84 and the fifth cladding layer 82 are etched through the second etching mask M6 to form a ridge structure 46C (step S38 in FIG. 21).

Figure 27A:
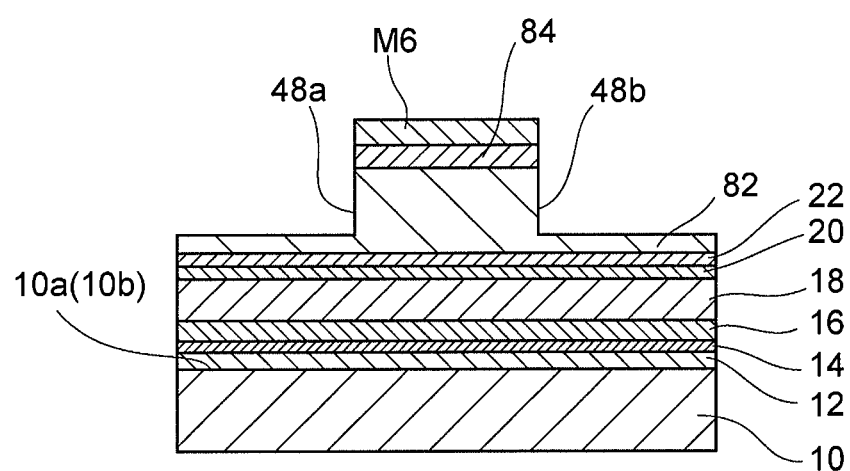
FIGS. 27A and 27B specifically illustrate a second etching step.
Figure 27B:
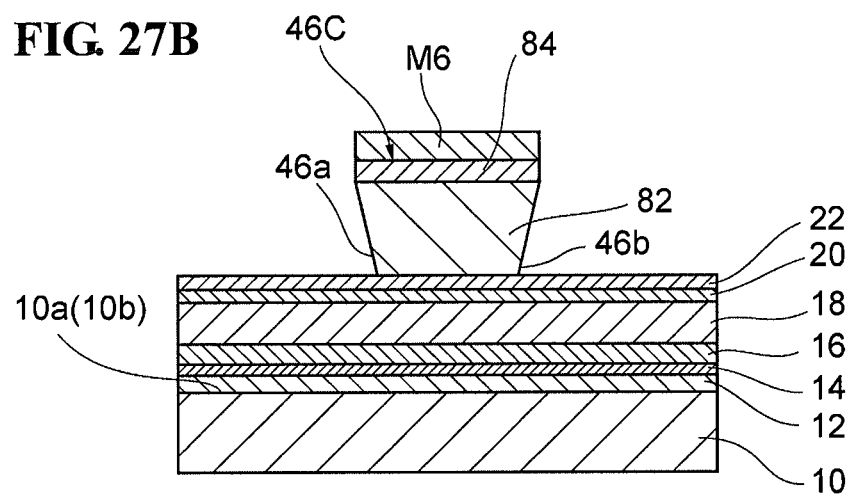
Figure 28A:
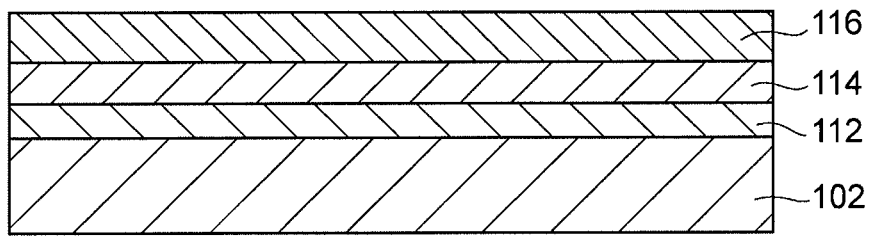
FIGS. 28A to 28C illustrate an example of a method for producing an integrated optical device having a butt-joint structure.
Figure 28B:
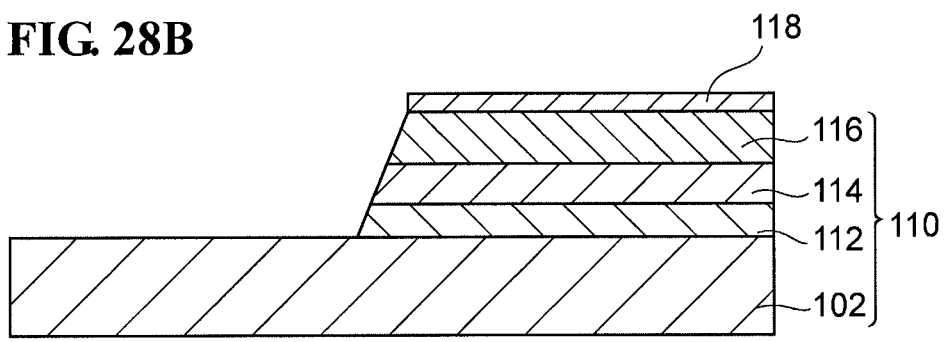
Figure 28C:
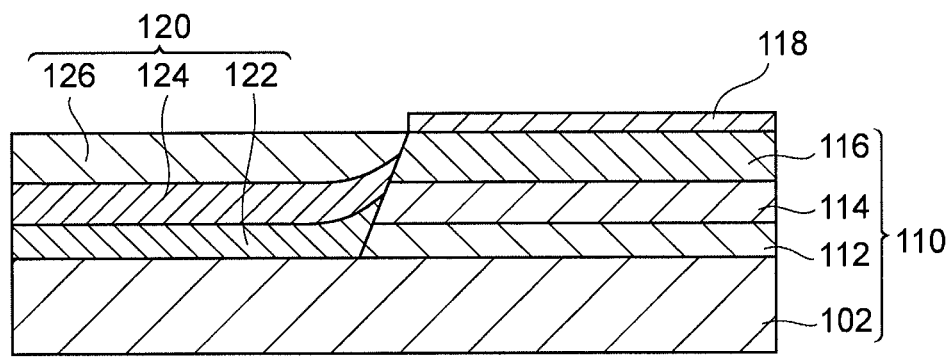
Figure 29:
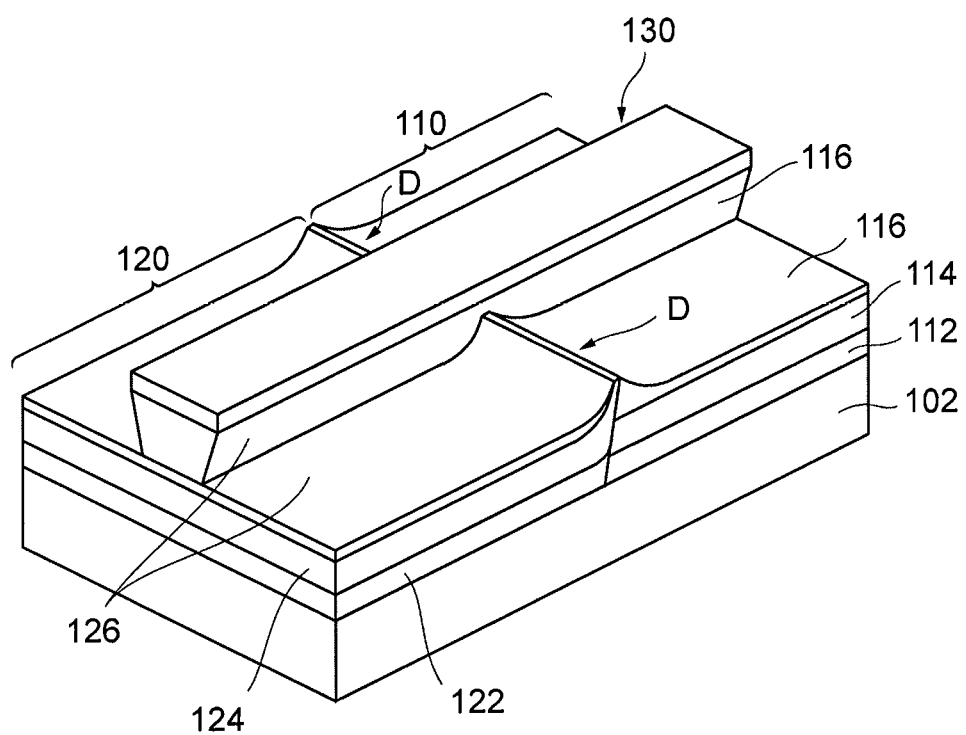
FIG. 29 is an explanatory view for a problem caused in a conventional method for producing an integrated optical device.

FIGS. 27A and 27B specifically illustrate the second etching step illustrated in FIG. 26. FIGS. 27A and 27B illustrate sections taken along line XII-XII in FIG. 26 (sections of the first stacked semiconductor layer 4C). Sections of the second stacked semiconductor layer 6C after the etching are similar to FIGS. 27A and 27B and hence are omitted.

Referring to FIG. 27A, in the second etching step, the p-type contact layer 84 and the fifth cladding layer 82 are etched by a dry etching process. An etching gas used for this dry etching may be, for example, a gas mixture of methane gas ($CH_4$) and hydrogen gas ($H_2$). This dry etching is stopped in the middle of the fifth cladding layer 82. In this dry etching, the first and second etch-stop layers 22 and 38 are not exposed. As a result of the dry etching, side surfaces 48a and 48b for the ridge structure are formed so as to be substantially perpendicular to the main surface 10a.

Referring to FIG. 27B, the p-type contact layer 84 and the fifth cladding layer 82 are then etched by a wet etching technique (depth control substep). An etchant used for this wet etching preferably has a higher etching rate for the fifth cladding layer 82 than for the first and second etch-stop layers 22 and 38. In an example, an etchant containing hydrogen bromide can be used. The wet etching is stopped when the first and second etch-stop layers 22 and 38 are exposed. As a result of the wet etching, side surfaces 46a and 46b of the ridge structure 46C are formed. As illustrated in FIG. 27B, the side surfaces 46a and 46b constitute a reverse mesa structure with respect to the main surface 10a and mainly include, for example, the (111) plane of an InP crystal.

After the above-described steps are performed, the subsequent steps (step S39 in FIG. 21) as in the first embodiment are performed. The resultant substrate product is then divided into chips to complete integrated optical devices.

In the above-described production method according to the third embodiment, during the first etching step S34, the first etch-stop layer 22 is etched by wet etching faster than the underlying layer (the first cladding layer 20). As a result, an overhang constituted by the first etching mask M5 is formed between the first cladding layer 20 and the first etching mask M5 (refer to the portion C1 in FIG. 23B). During growth of the second optical waveguiding layer 34 in the second growth step S35, this overhang suppresses rising up of the second optical waveguiding layer 34 in a region near the boundary between the second optical waveguiding layer 34 and the first stacked semiconductor layer 4C (refer to the portion C1 in FIG. 24B). As a result, in the formation of the ridge structure 46C in the second etching step S38, as illustrated in FIG. 26, formation of raised portions in regions adjacent to the side surfaces of the ridge structure 46C can be suppressed and the flatness of these regions can be enhanced. Therefore, by using the method for producing an integrated optical device according to the third embodiment, disturbance in the optical waveguide mode can be suppressed. Furthermore, lasing characteristics of the semiconductor laser can be improved.

In the production method according to the third embodiment, in the first growth step S32, layers up to the first etch-stop layer 22 used for controlling etching depth in the second etching step S38 are grown. Subsequently, in the third growth step S36, the cladding layer (fifth cladding layer 82) on the first etch-stop layer 22 is grown. In the first etching step S34, the overhang (refer to the portion C1 in FIG. 23B) is formed by using the difference in etching rates for the first etch-stop layer 22 and the underlying layer (first cladding layer 20). Thus, formation of a semiconductor layer for forming such an overhang, at an intermediate position of the ridge structure 46C formed in the second etching step S38, is not necessary. In the production method according to the third embodiment, generation of the stepped structure in the side surfaces 46a and 46b of the ridge structure 46C due to the presence of the semiconductor layer (for example, refer to FIG. 9B in the first embodiment) can also be avoided. Accordingly, operation characteristics of an integrated optical device such as lasing characteristics of the semiconductor laser can be further improved. In addition, the shape stability of the ridge structure 46C can be enhanced. Furthermore, in the third embodiment, the formation of an overhang at an intermediate position of the first stacked semiconductor layer 4C is not necessary. Accordingly, the semiconductor layers can be grown in the second growth step S35 so as to have high crystal quality and generation of stacking faults can be reduced.

In particular, in the third embodiment, the distance between the active layer 18 and the first etch-stop layer 22 (that is, the thickness of the first cladding layer 20) is made 150 nm or less. Thus, the distance between the ridge structure 46C and the active layer 18 can be decreased. Accordingly, the first etch-stop layer 22 can be suitably used for formation of an overhang in the first etching step S34 and also for control of etching depth in the second etching step S38.

The methods for producing an integrated optical device according to preferred embodiments of the present invention have been described so far with reference to examples, that is, structures in which a distributed feedback (DFB) laser diode and an EA optical modulator are integrated. However, the present invention is not necessarily limited to these embodiments and various modifications can be made without departing from the spirit and scope of the present invention.

What is claimed is:

1. A method for producing an integrated optical device, comprising the steps of:

preparing a substrate including first and second regions arranged in a predetermined direction;

growing, on the first and second regions of the substrate, a first stacked semiconductor layer including a first optical waveguiding layer, first and second cladding layers positioned on the first optical waveguiding layer, and a first etch-stop layer positioned between the first and second cladding layers, the first etch-stop layer having a composition different from compositions of the first and second cladding layers;

etching the first stacked semiconductor layer through a first etching mask formed on the first region until the first optical waveguiding layer is exposed;

selectively growing, on the second region through the first etching mask, a second stacked semiconductor layer including a second optical waveguiding layer, third and fourth cladding layers positioned on the second optical waveguiding layer, and a second etch-stop layer positioned between the third and fourth cladding layers, the second etch-stop layer having a composition different from compositions of the third and fourth cladding layers; and forming a ridge structure by etching the second and fourth cladding layers through a second etching mask formed on the first and second stacked semiconductor layers, the second etching mask longitudinally extending in the predetermined direction, wherein the step of etching the first stacked semiconductor layer includes a step of forming a first overhang between the first and second cladding layers by selectively etching the first etch-stop layer by wet etching with an etchant having a higher etching rate for the first etch-stop layer than for the first and second cladding layers, the first overhang being constituted by the second cladding layer.

2. The method according to claim 1, wherein the first and second cladding layers are formed of InP,
the first etch-stop layer is formed of InGaAsP, and
in the step of forming the first overhang, the first etch-stop layer is etched by the etchant containing sulfuric acid and hydrogen peroxide.

3. The method according to claim 1, wherein, in the step of forming the ridge structure, the second and fourth cladding layers are etched by wet etching with an etchant having higher etching rates for the second and fourth cladding layers than for the first and second etch-stop layers.

4. The method according to claim 3, wherein the first to fourth cladding layers are formed of InP,
the first and second etch-stop layers are formed of InGaAsP, and
in the step of forming the ridge structure, the second and fourth cladding layers are etched by wet etching with the etchant containing hydrogen bromide.

5. The method according to claim 1, wherein the first stacked semiconductor layer further includes a side-etching layer formed on the second cladding layer, the side-etching layer having a different composition from a composition of the second cladding layer, and
the step of etching the first stacked semiconductor layer further includes a step of forming a second overhang between the second cladding layer and the first etching mask by selectively etching the side-etching layer by wet etching with an etchant having a higher etching rate for the side-etching layer than for the second cladding layer, the second overhang being constituted by the first etching mask.

6. The method according to claim 5, wherein the first to fourth cladding layers are formed of InP,
the first and second etch-stop layers and the side-etching layer are formed of InGaAsP,
in the steps of forming the first and second overhangs in the step of etching the first stacked semiconductor layer, the first etch-stop layer and the side-etching layer are etched by the etchant containing sulfuric acid and hydrogen peroxide, and
in the step of forming the ridge structure, the second and fourth cladding layers are etched by wet etching with the etchant containing hydrogen bromide.

7. The method according to claim 1, further comprising:
after the step of selectively growing the second stacked semiconductor layer, a step of growing an upper cladding layer and a contact layer on the first stacked semiconductor layer and the second stacked semiconductor layer; and
after the step of forming the ridge structure, a step of forming electrodes on the contact layer, the electrodes being formed on the first and second stacked semiconductor layers, respectively.

8. The method according to claim 7, wherein the step of forming the electrodes includes a step of electrically separating the first stacked semiconductor layer and the second stacked semiconductor layer from each other by etching a portion of contact layer formed between the first and second stacked semiconductor layers.

9. The method according to claim 1, wherein the first stacked semiconductor layer further includes a contact layer formed on the second cladding layer, the contact layer having a composition different from a composition of the second cladding layer, and
the step of etching the first stacked semiconductor layer further includes a step of forming a third overhang between the second cladding layer and the first etching mask by selectively etching the contact layer by wet etching with an etchant having a higher etching rate for the contact layer than for the second cladding layer, the third overhang being constituted by the first etching mask.

10. The method according to claim 9, wherein the first to fourth cladding layers are formed of InP, the first and second etch-stop layers are formed of InGaAsP, and the contact layer is formed of InGaAs,
in the steps of forming the first and third overhangs in the step of etching the first stacked semiconductor layer, the first etch-stop layer and the contact layer are etched by the etchant containing sulfuric acid and hydrogen peroxide, and
in the step of forming the ridge structure, the second and fourth cladding layers are etched by wet etching with the etchant containing hydrogen bromide.

11. A method for producing an integrated optical device, comprising the steps of:
preparing a substrate including first and second regions arranged in a predetermined direction;
growing, on the first and second regions of the substrate, a first stacked semiconductor layer including a first optical waveguiding layer, a first cladding layer positioned on the first optical waveguiding layer, and a first etch-stop layer positioned on the first cladding layer, the first etch-stop layer having a composition different from a composition of the first cladding layer;
etching the first stacked semiconductor layer through a first etching mask formed on the first region until the first optical waveguiding layer is exposed;
selectively growing, on the second region through the first etching mask, a second stacked semiconductor layer including a second optical waveguiding layer, a third cladding layer positioned on the second optical waveguiding layer, and a second etch-stop layer positioned on the third cladding layer, the second etch-stop layer having a composition different from a composition of the third cladding layer;
growing a fifth cladding layer on the first and second stacked semiconductor layers, the fifth cladding layer having a composition different from compositions of the first and second etch-stop layers; and
forming a ridge structure by etching the fifth cladding layer through a second etching mask formed on the fifth cladding layer on the first and second regions, the second etching mask longitudinally extending in the predetermined direction,
wherein the step of etching the first stacked semiconductor layer includes a step of forming an overhang between the first cladding layer and the first etching mask by selectively etching the first etch-stop layer by wet etching with an etchant having a higher etching rate for the first etch-stop layer than for the first cladding layer, the overhang being constituted by the first etching mask.

12. The method according to claim 11, wherein the first, third, and fifth cladding layers are formed of InP,
the first and second etch-stop layers are formed of InGaAsP, and in the step of forming the overhang, the first etch-stop layer is etched by the etchant containing sulfuric acid and hydrogen peroxide.

13. The method according to claim 11, wherein, in the step of forming the ridge structure, the fifth cladding layer is etched by wet etching with an etchant having a higher etching rate for the fifth cladding layer than for the first and second etch-stop layers.

14. The method according to claim 13, wherein the first, third, and fifth cladding layers are formed of InP, the first and second etch-stop layers are formed of InGaAsP, and in the step of forming the ridge structure, the fifth cladding layer is etched by wet etching with the etchant containing hydrogen bromide.

* * * * *